US012796120B2

(12) United States Patent
Motokubota et al.

(10) Patent No.: US 12,796,120 B2
(45) Date of Patent: Nov. 10, 2026

(54) IMAGING DEVICE

(71) Applicant: SONY SEMICONDUCTOR SOLUTIONS CORPORATION, Kanagawa (JP)

(72) Inventors: Masaya Motokubota, Kanagawa (JP); Atsushi Toda, Kanagawa (JP); Susumu Ooki, Kanagawa (JP); Kazuhiro Goi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 344 days.

(21) Appl. No.: 18/580,221

(22) PCT Filed: Jul. 19, 2022

(86) PCT No.: PCT/JP2022/027991
§ 371 (c)(1), (2) Date: Jan. 18, 2024

(87) PCT Pub. No.: WO2023/013394
PCT Pub. Date: Feb. 9, 2023

(65) Prior Publication Data
US 2025/0089385 A1 Mar. 13, 2025

(30) Foreign Application Priority Data
Aug. 6, 2021 (JP) ................................. 2021-129695

(51) Int. Cl.
*H10F 39/18* (2025.01)
*H10F 39/00* (2025.01)

(52) U.S. Cl.
CPC ....... *H10F 39/182* (2025.01); *H10F 39/8057* (2025.01); *H10F 39/8067* (2025.01)

(58) Field of Classification Search
CPC ................ H10F 39/806; H10F 39/807; H10F 39/8057; H10F 39/8063; H10F 39/8053; G02B 27/1013; G02B 1/002
See application file for complete search history.

(56) References Cited

U.S. PATENT DOCUMENTS

2013/0099343 A1* 4/2013 Toshikiyo ............ H10F 39/806 257/432
2018/0102389 A1* 4/2018 Lee ...................... H10F 39/807
(Continued)

FOREIGN PATENT DOCUMENTS

JP 2012-015424 A 1/2012
JP 2018-156999 A 10/2018
(Continued)

OTHER PUBLICATIONS

International Search Report and Written Opinion of PCT Application No. PCT/JP2022/027991, issued on Sep. 27, 2022, 11 pages of ISRWO.

*Primary Examiner* — Alia Sabur
(74) *Attorney, Agent, or Firm* — CHIP LAW GROUP

(57) ABSTRACT

An imaging device of an embodiment of the present disclosure includes a light separator, a first pixel, a second pixel, and a light shielding unit. The light separator separates first wavelength light included in a first wavelength region and second wavelength light included in a second wavelength region from incident light, and includes a structure whose size is equal to or less than a wavelength of incident light. The first pixel includes a first photoelectric converter that selectively receives the first wavelength light and performs photoelectric conversion on the first wavelength light. The second pixel is adjacent to the first pixel and includes a second photoelectric converter that selectively receives the second wavelength light and performs photoelectric conversion on the second wavelength light. The light shielding unit
(Continued)

is provided at a boundary between the first pixel and the second pixel and blocks incident light.

19 Claims, 23 Drawing Sheets

(56) References Cited

U.S. PATENT DOCUMENTS

| | | | | |
|---|---|---|---|---|
| 2019/0123083 | A1* | 4/2019 | Borthakur | H10F 39/8053 |
| 2020/0033519 | A1* | 1/2020 | Toda | G02B 6/4206 |
| 2021/0126029 | A1* | 4/2021 | Roh | H10F 39/156 |
| 2021/0127101 | A1* | 4/2021 | Roh | H04N 23/55 |
| 2021/0167110 | A1* | 6/2021 | Roh | H10F 39/8023 |

FOREIGN PATENT DOCUMENTS

| | | | |
|---|---|---|---|
| JP | 2019-184986 | A | 10/2019 |
| JP | 2020-123964 | A | 8/2020 |
| WO | 2013/080872 | A1 | 6/2013 |
| WO | 2016/012911 | A1 | 1/2016 |
| WO | 2016/158128 | A1 | 10/2016 |
| WO | 2018/180569 | A1 | 10/2018 |
| WO | 2019/124562 | A1 | 6/2019 |

* cited by examiner

[ FIG. 1 ]
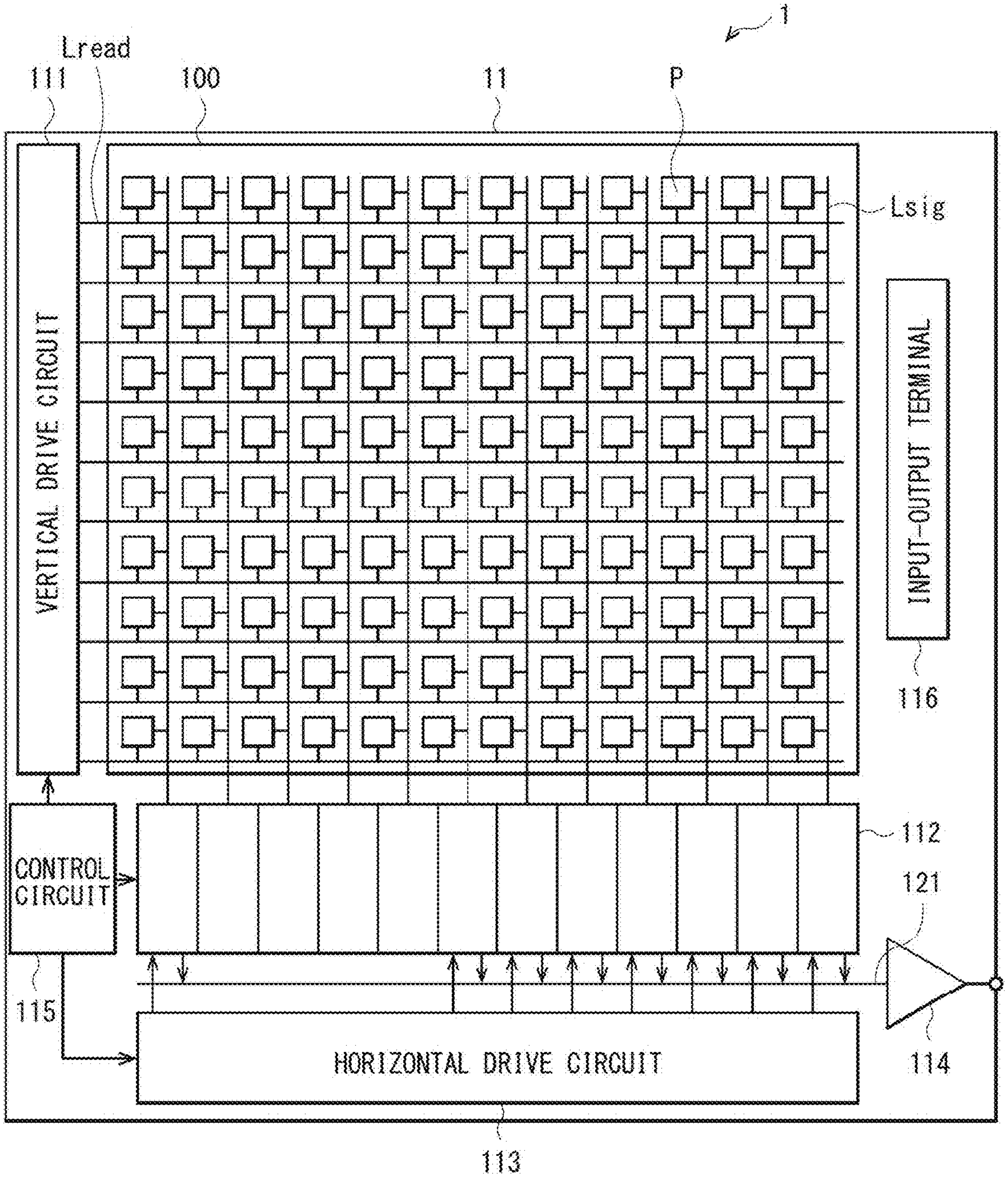

[ FIG. 2 ]
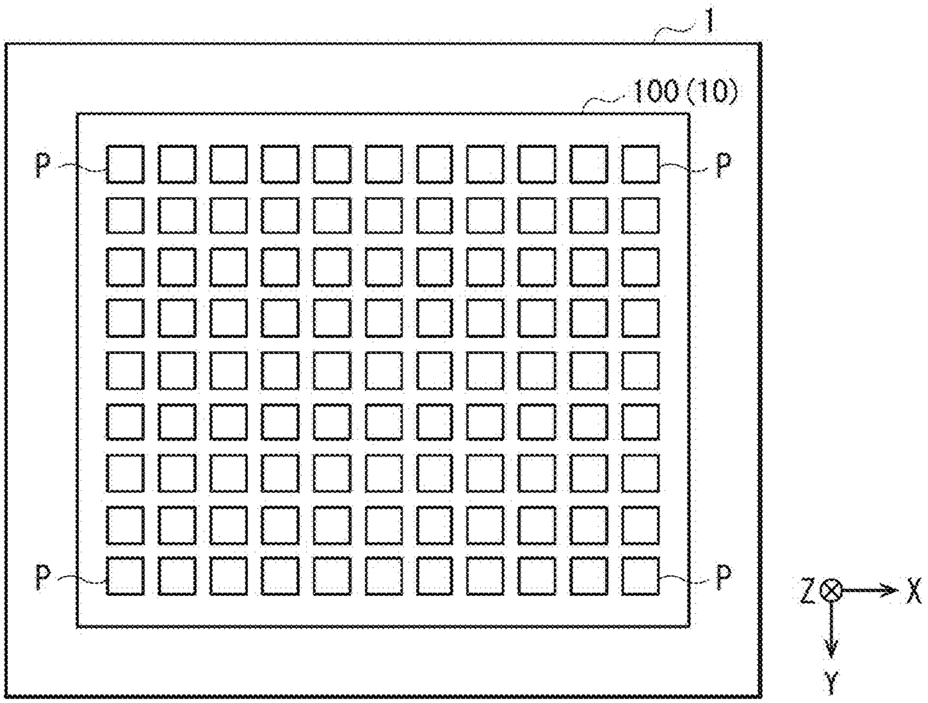

[ FIG. 3 ]
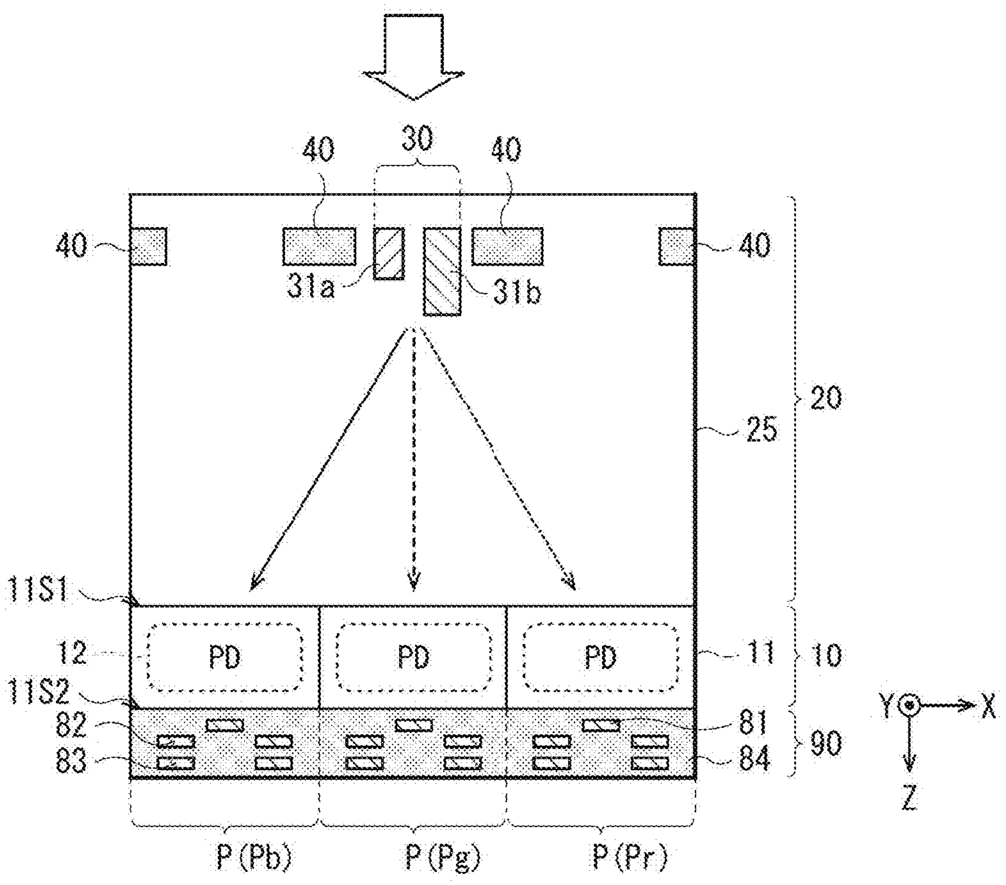
[ FIG. 4 ]
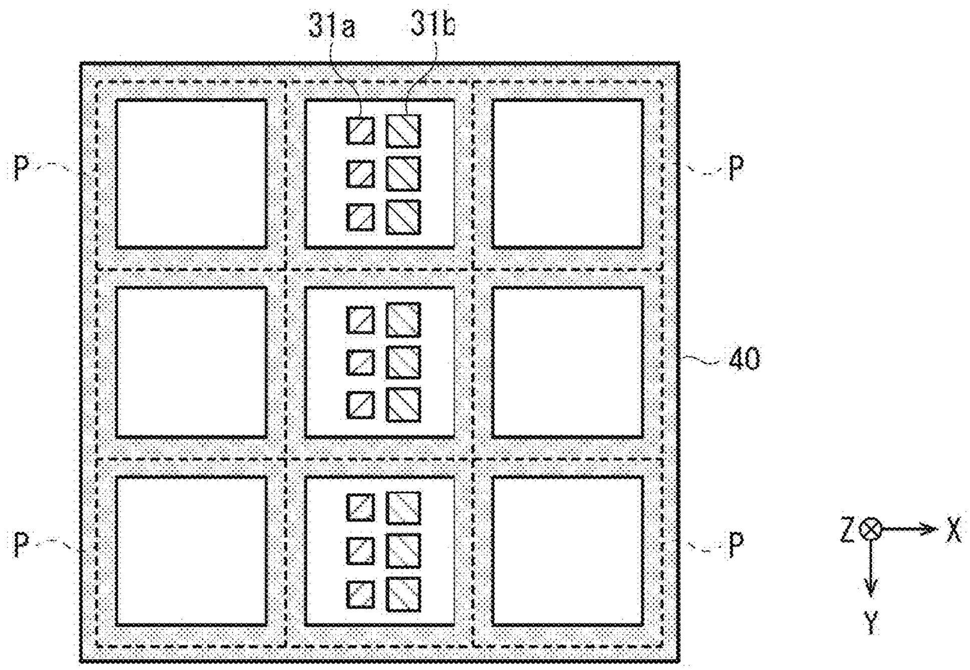

[ FIG. 5A ]
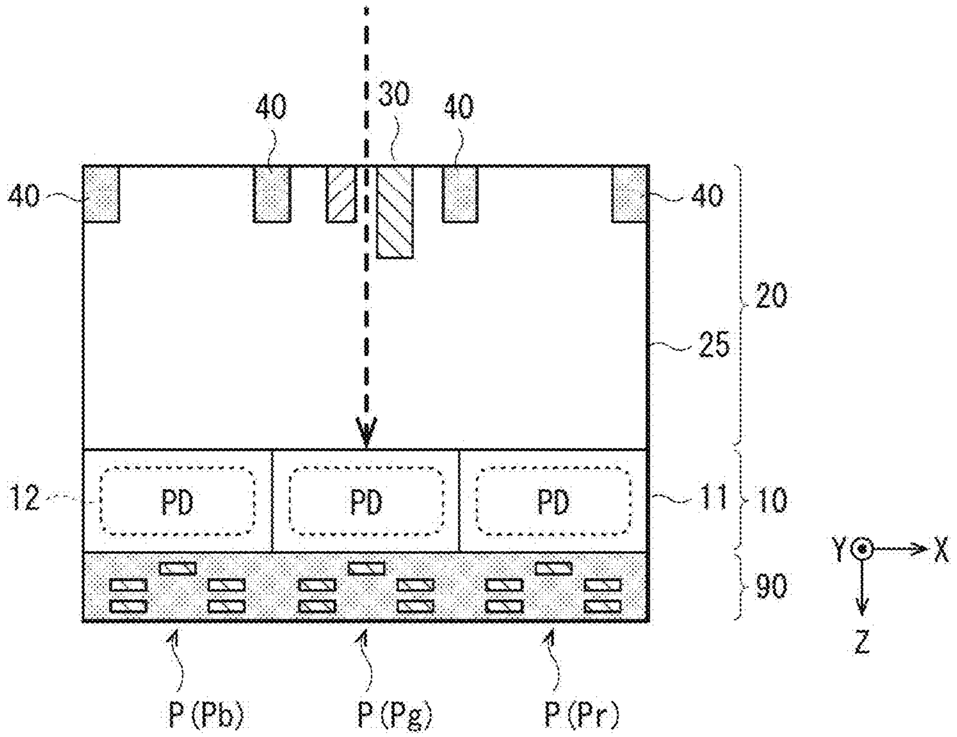
[ FIG. 5B ]
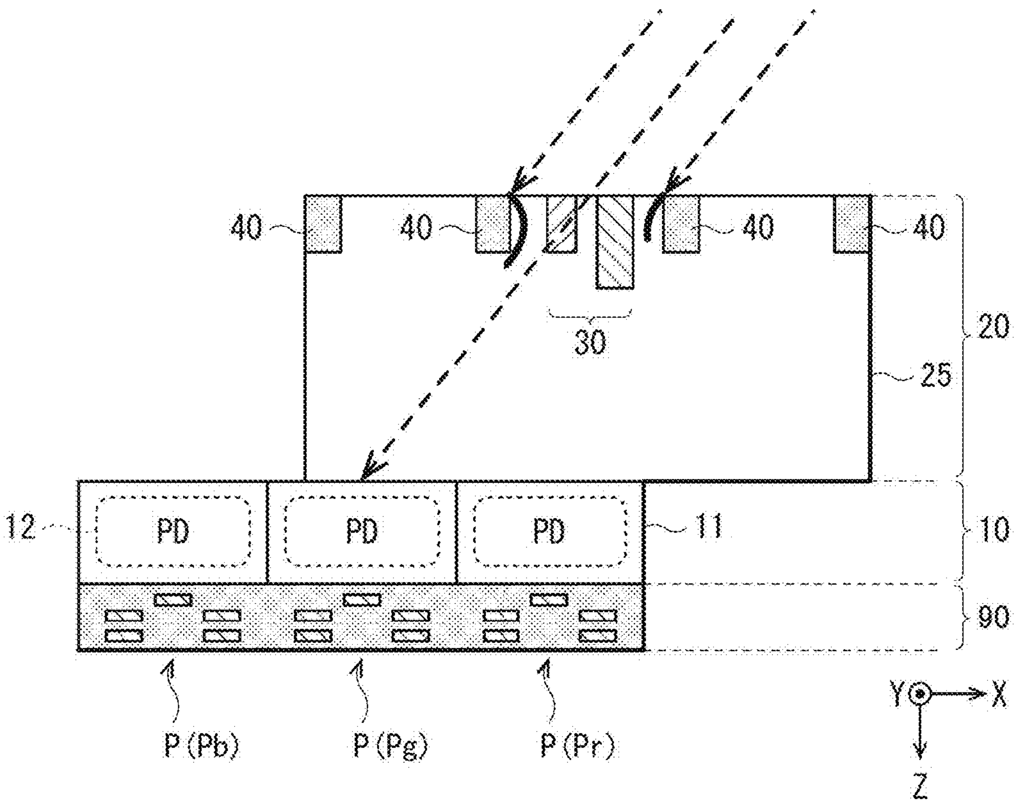

[ FIG. 6A ]
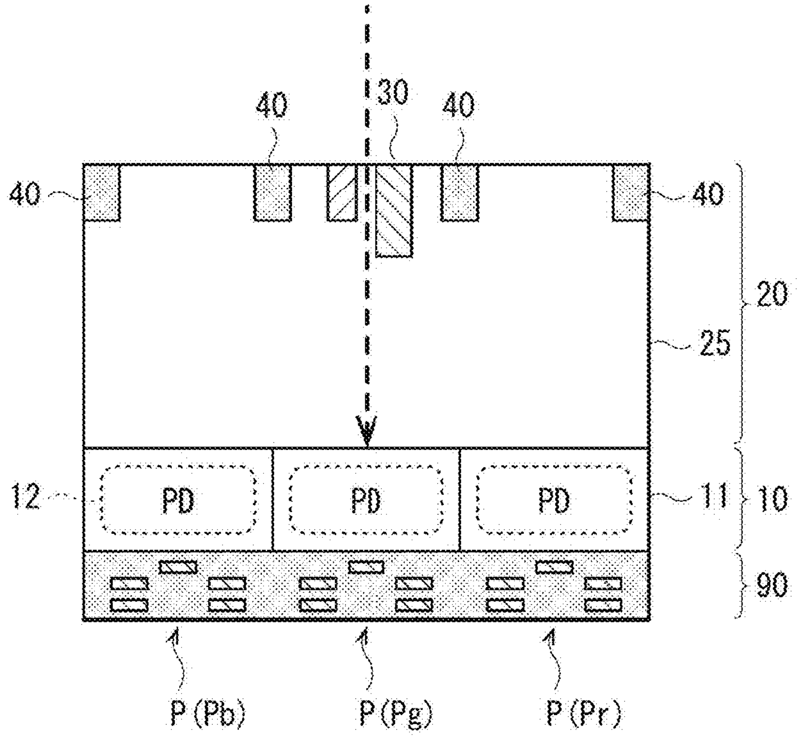
[ FIG. 6B ]
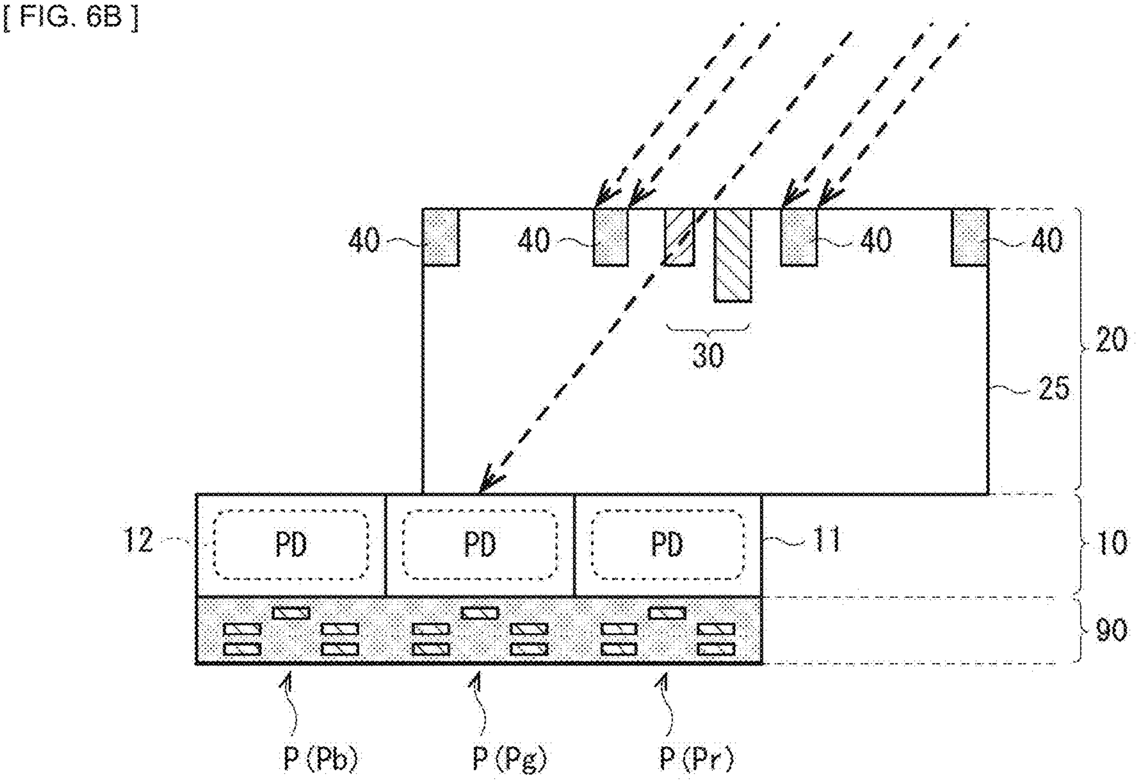

[ FIG. 7 ]
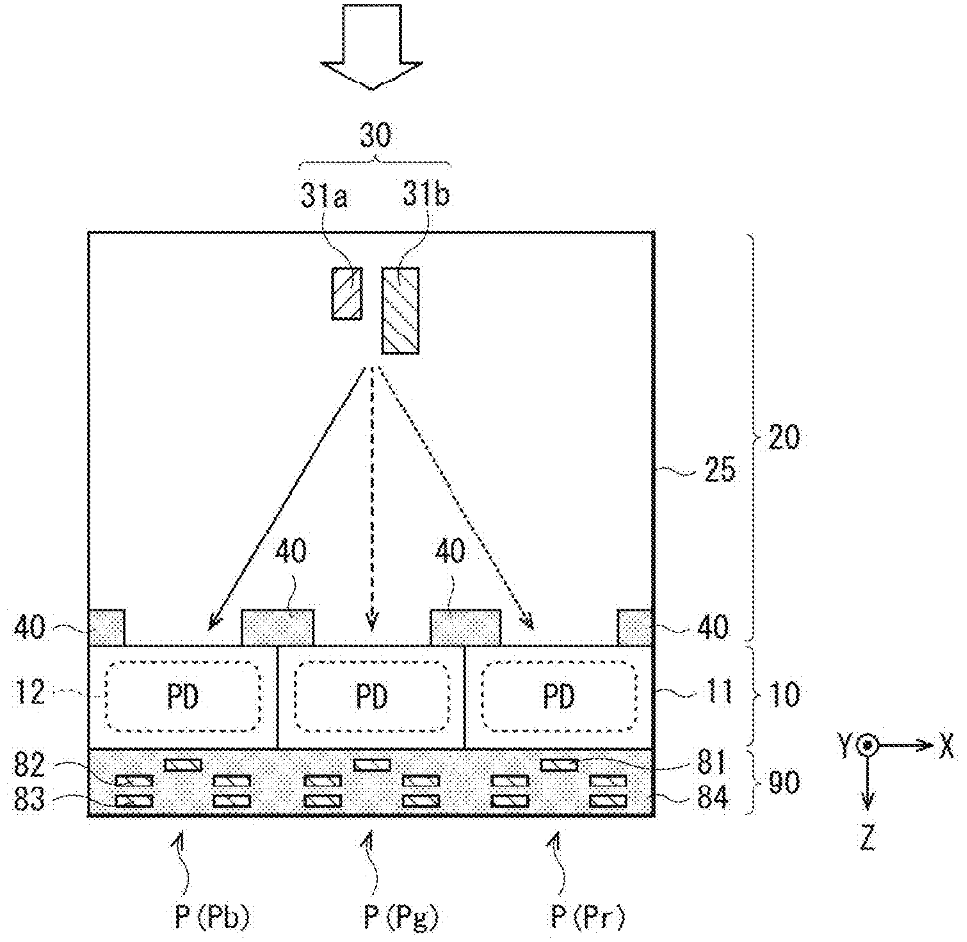
[ FIG. 8 ]
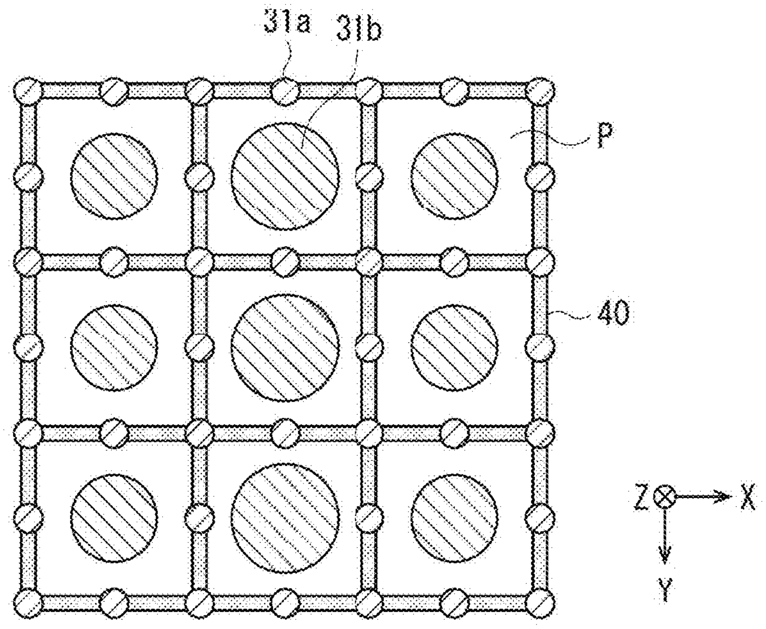

[FIG. 9]
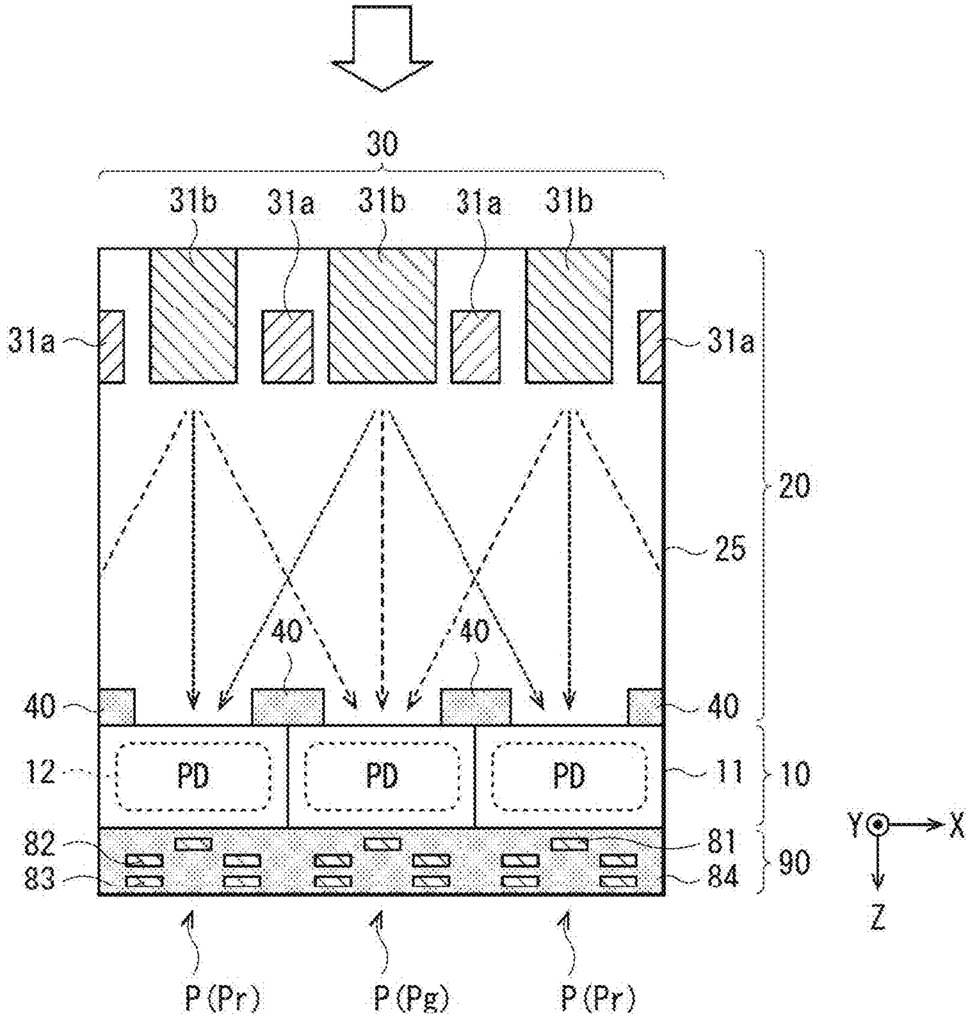

[ FIG. 10A ]
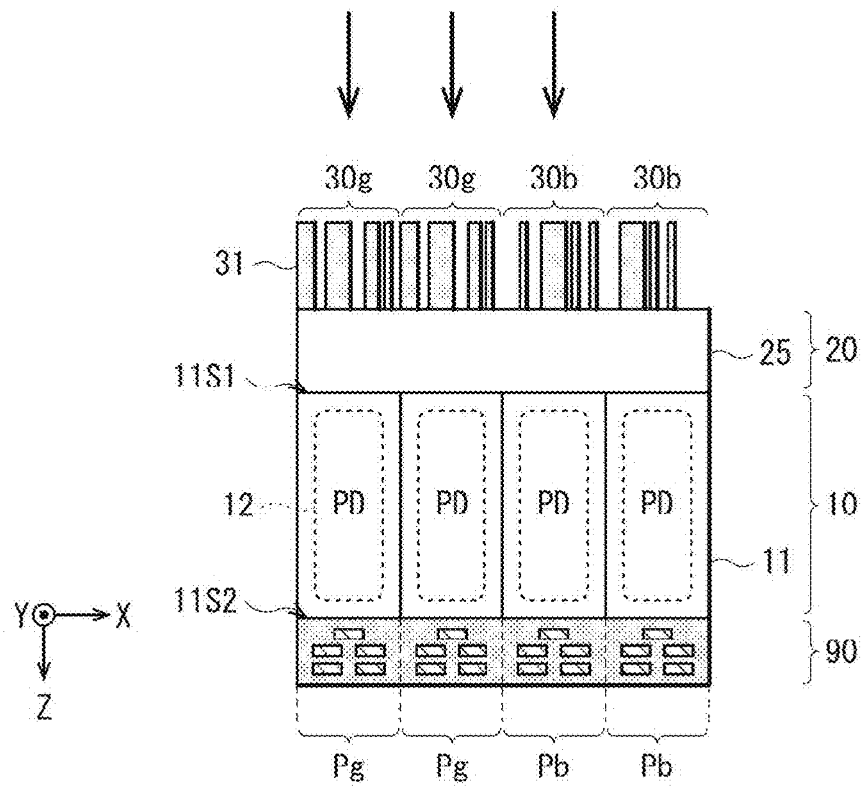
[ FIG. 10B ]
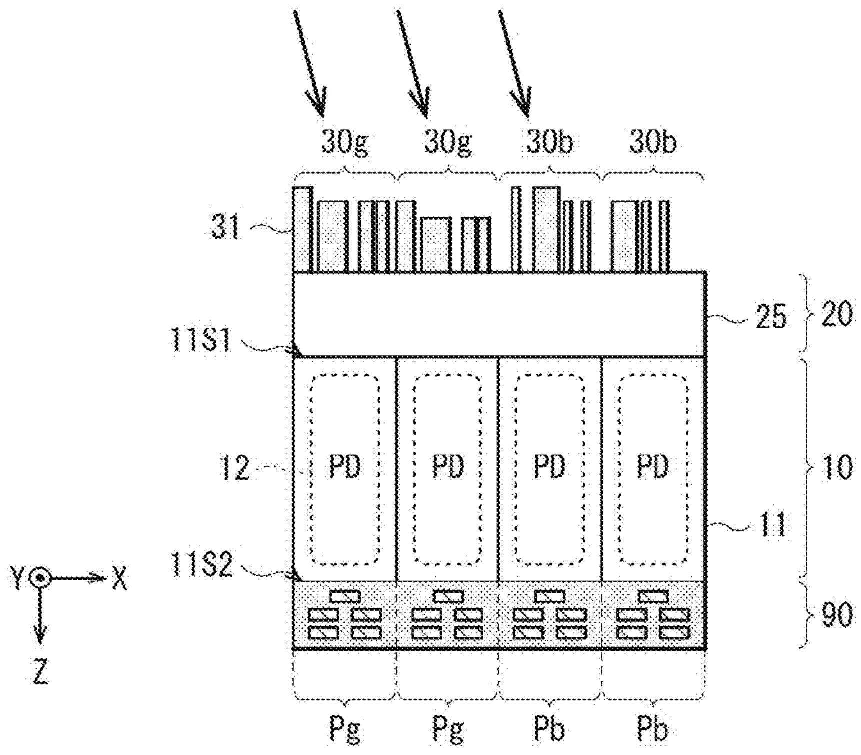

[ FIG. 10C ]
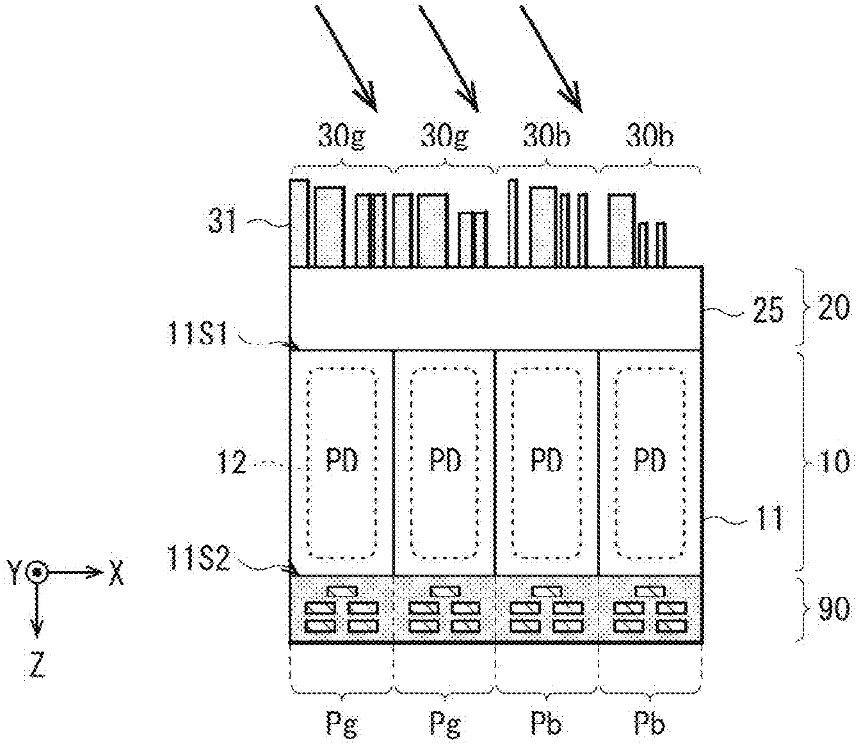
[ FIG. 11A ]
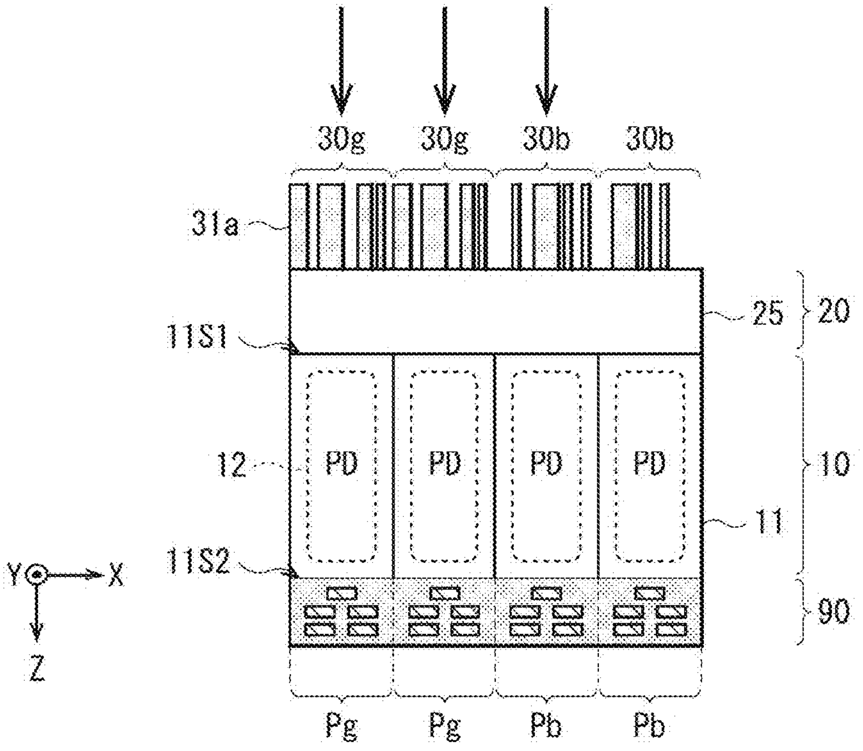

[ FIG. 11B ]
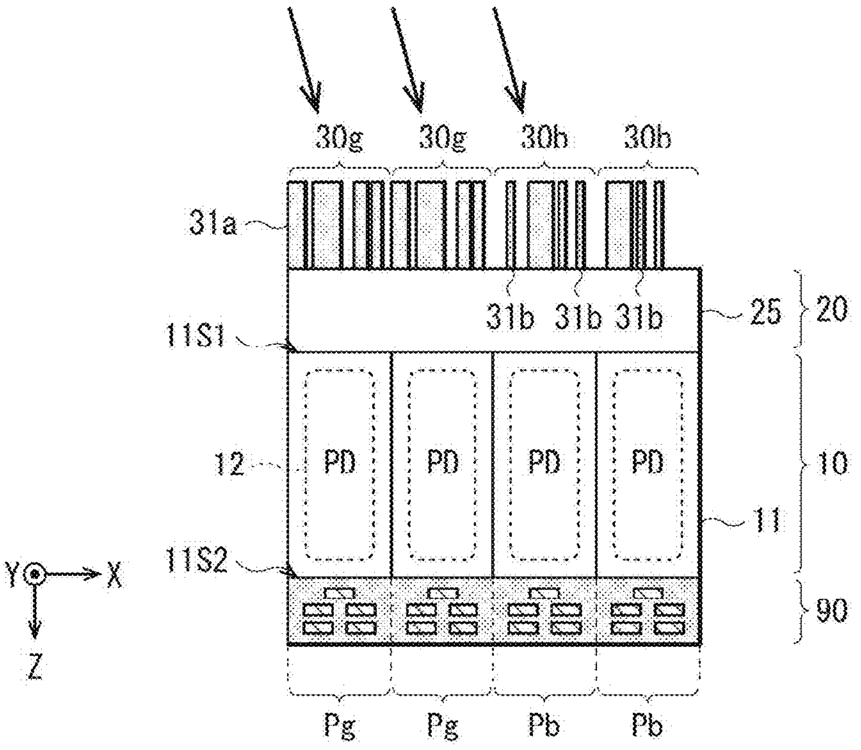
[ FIG. 11C ]
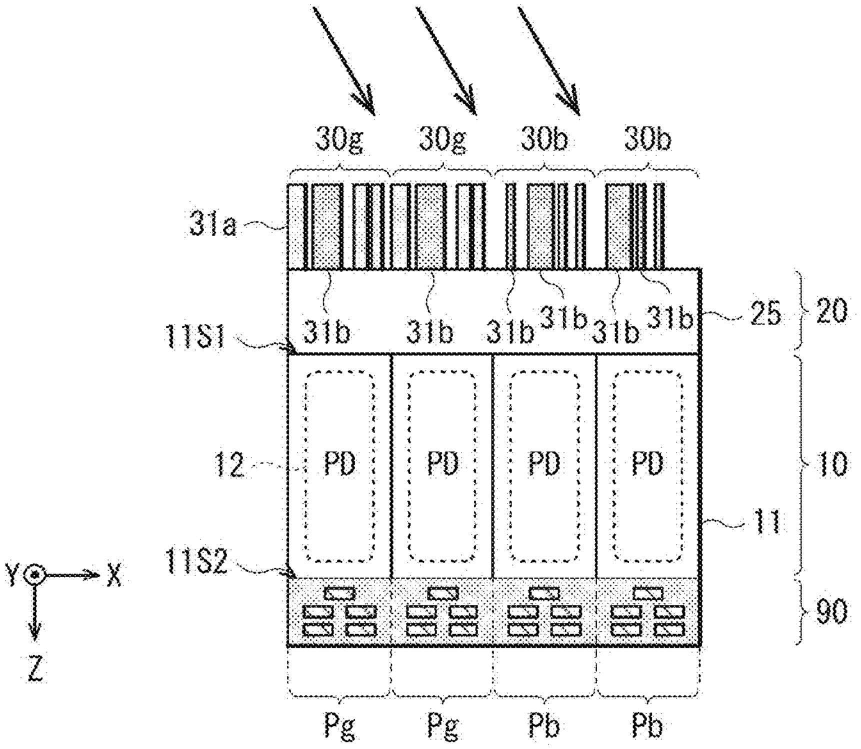

[ FIG. 12A ]
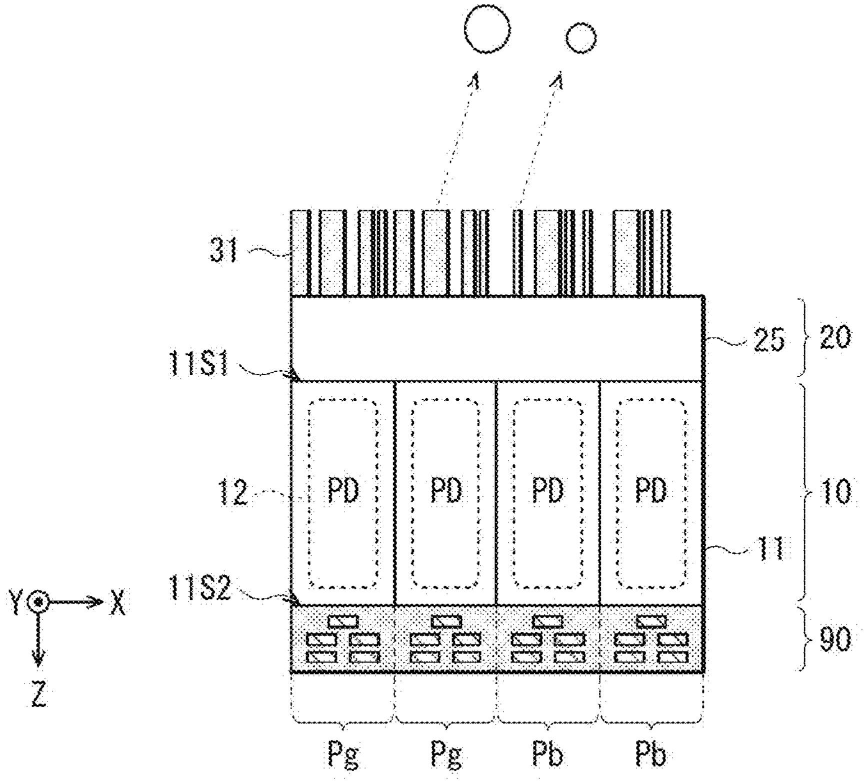
[ FIG. 12B ]
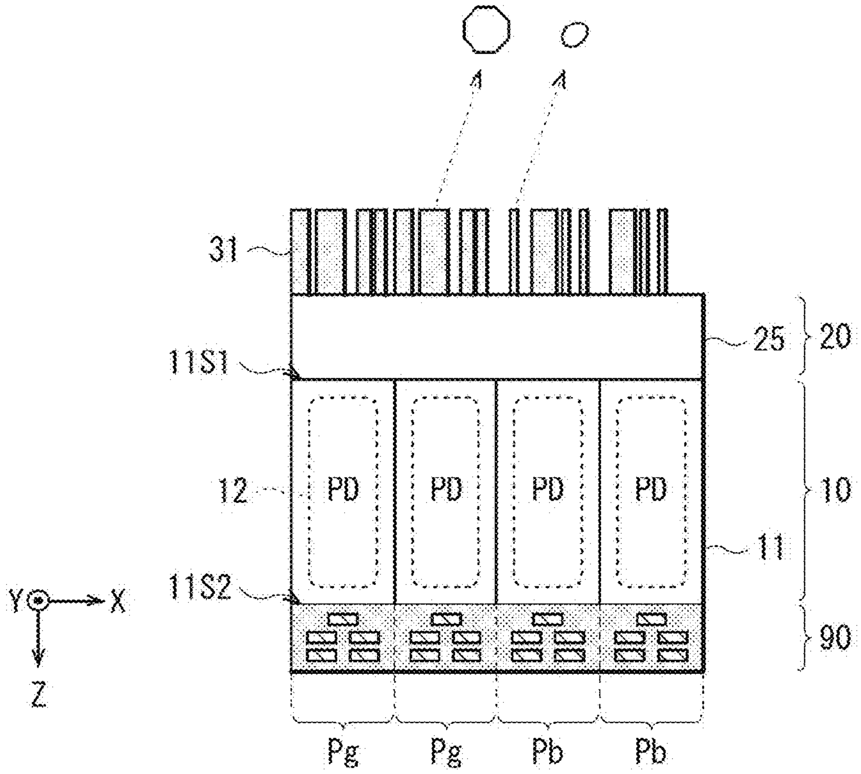

[ FIG. 12C ]
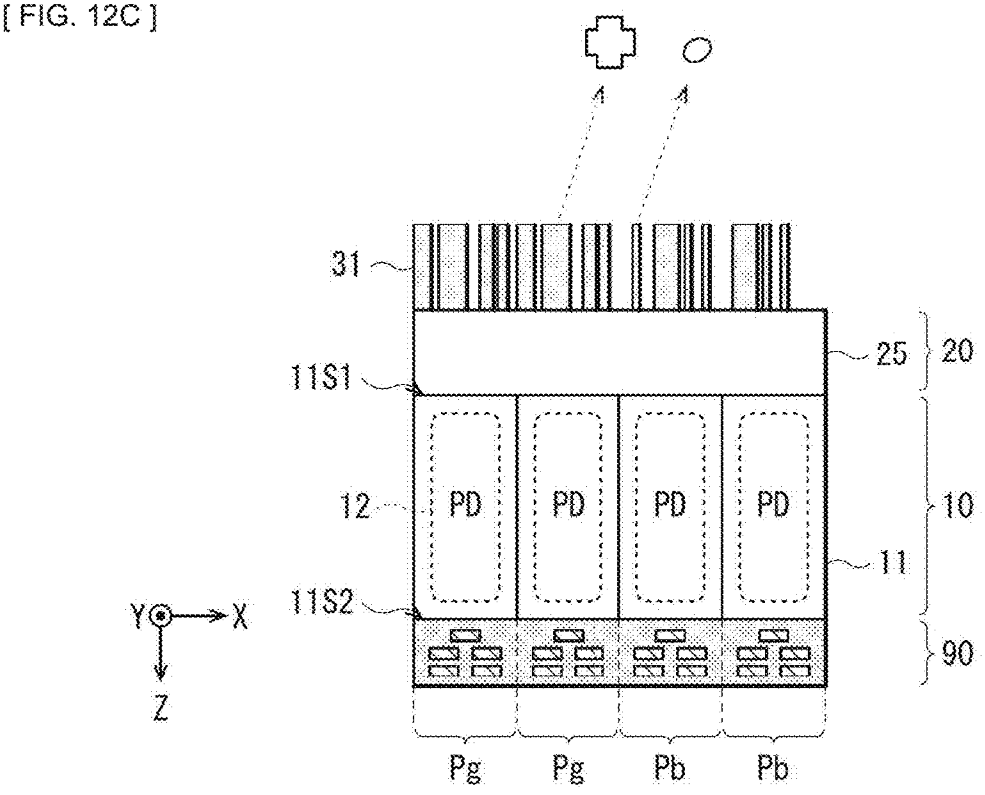

[ FIG. 13 ]
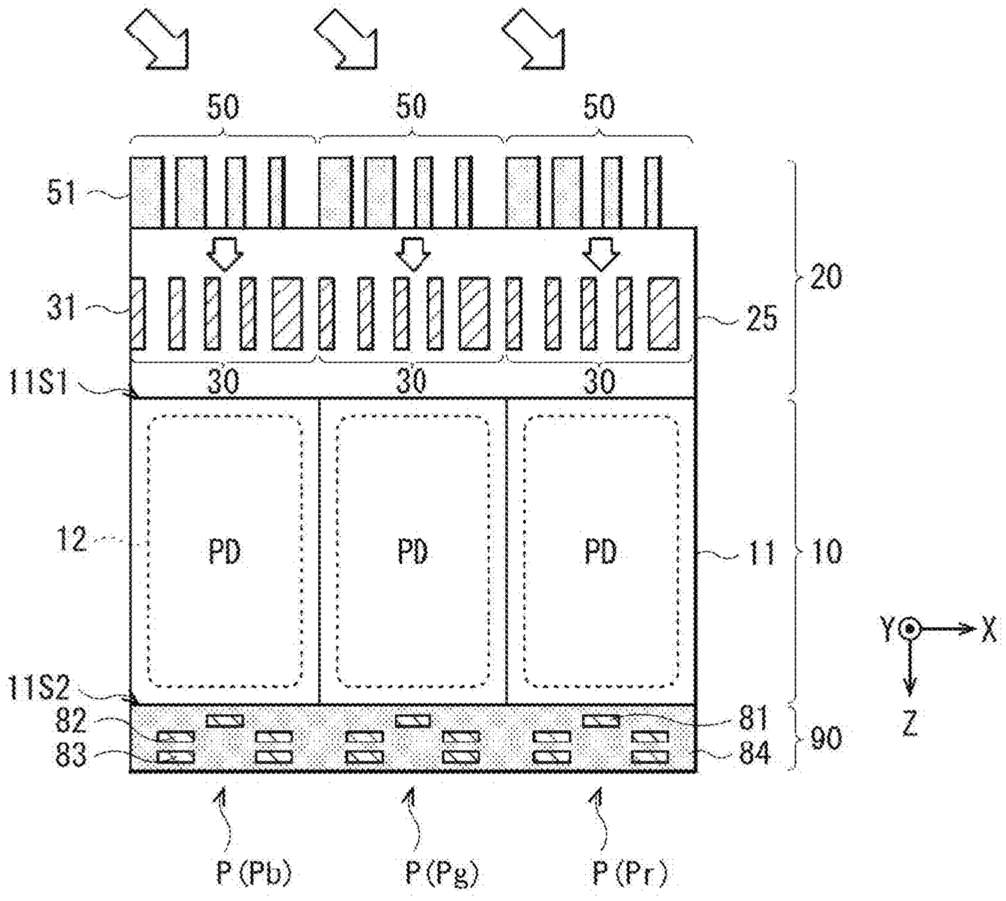

[ FIG. 14 ]
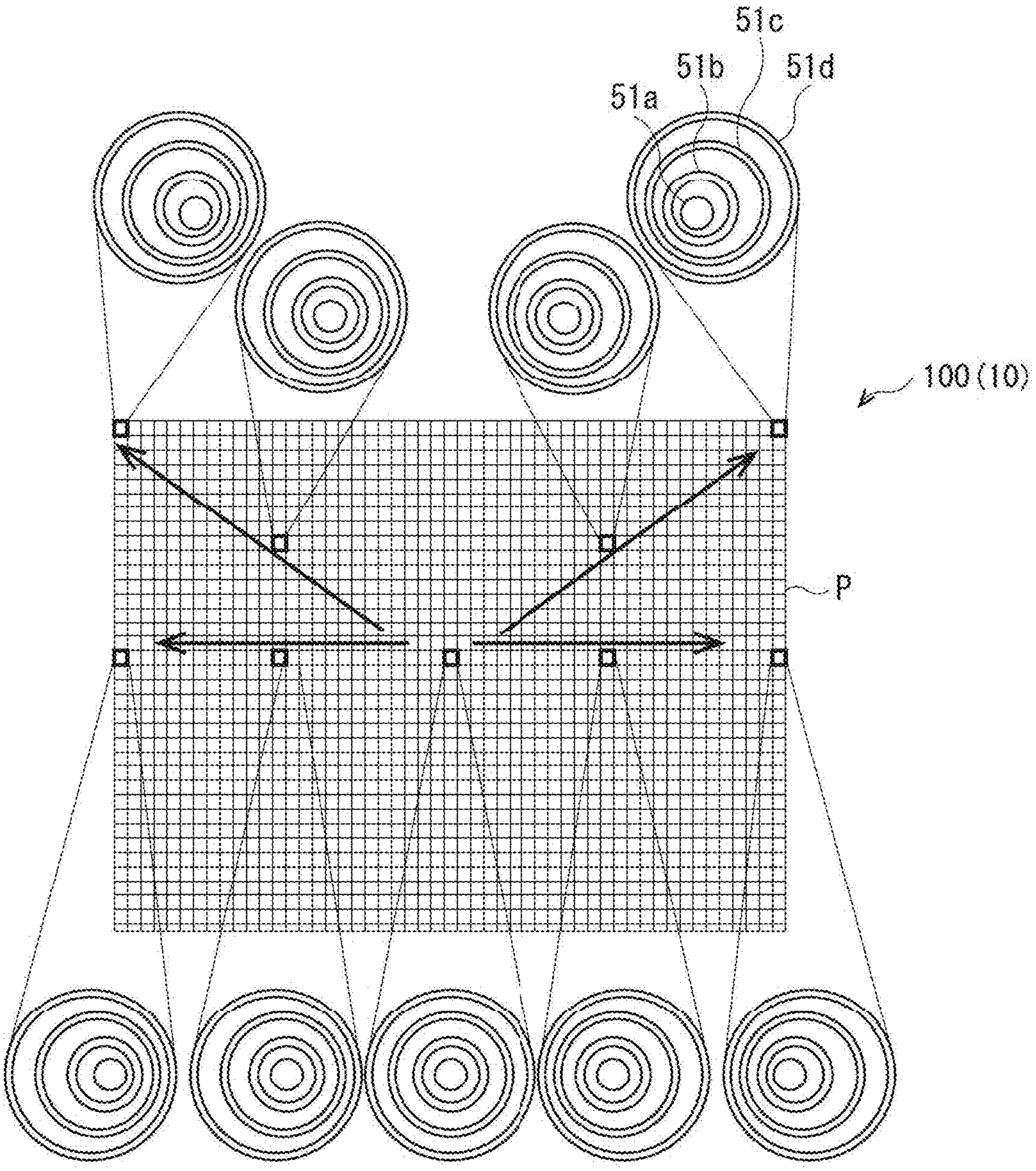

[ FIG. 15 ]
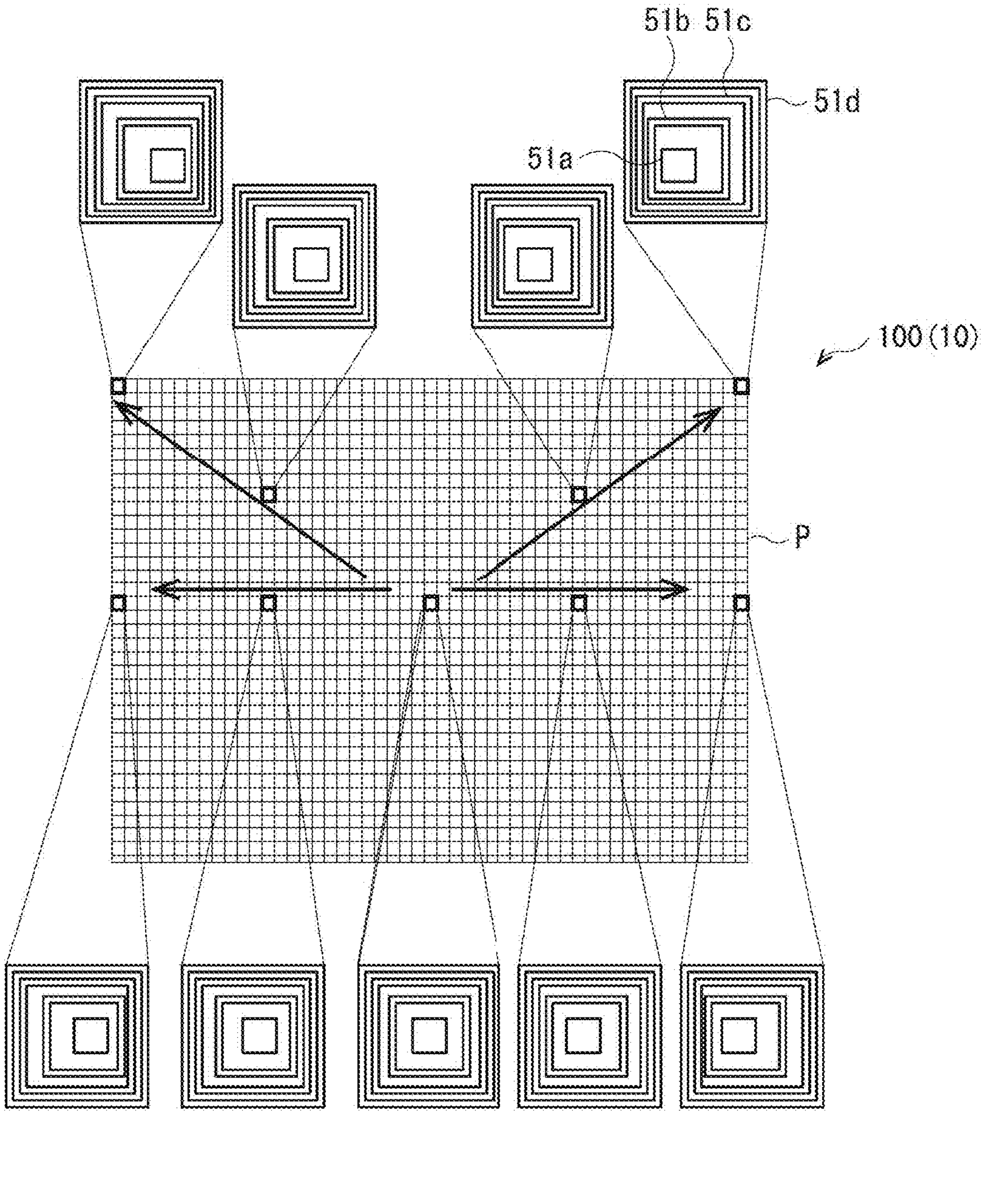

[ FIG. 16 ]
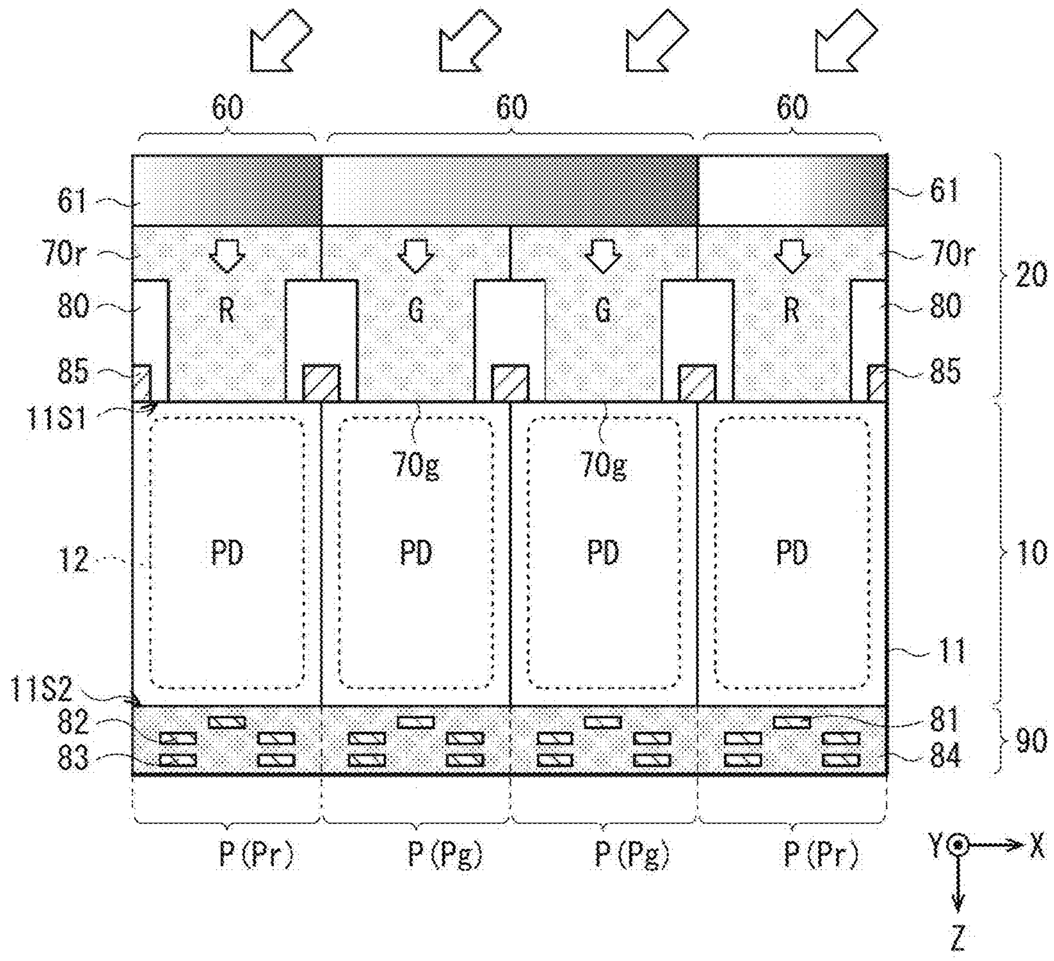

[ FIG. 17A ]
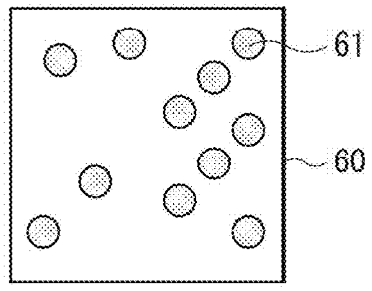
[ FIG. 17B ]
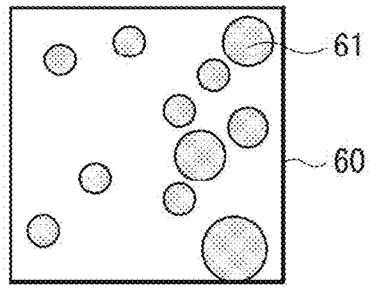
[ FIG. 17C ]
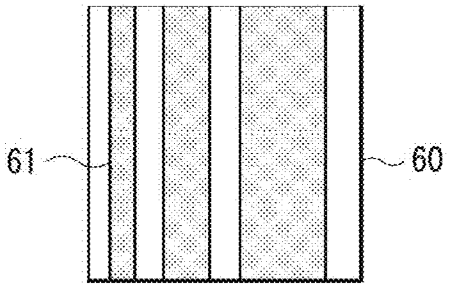
[ FIG. 17D ]
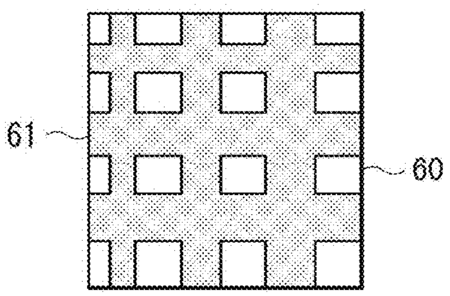

[ FIG. 18 ]
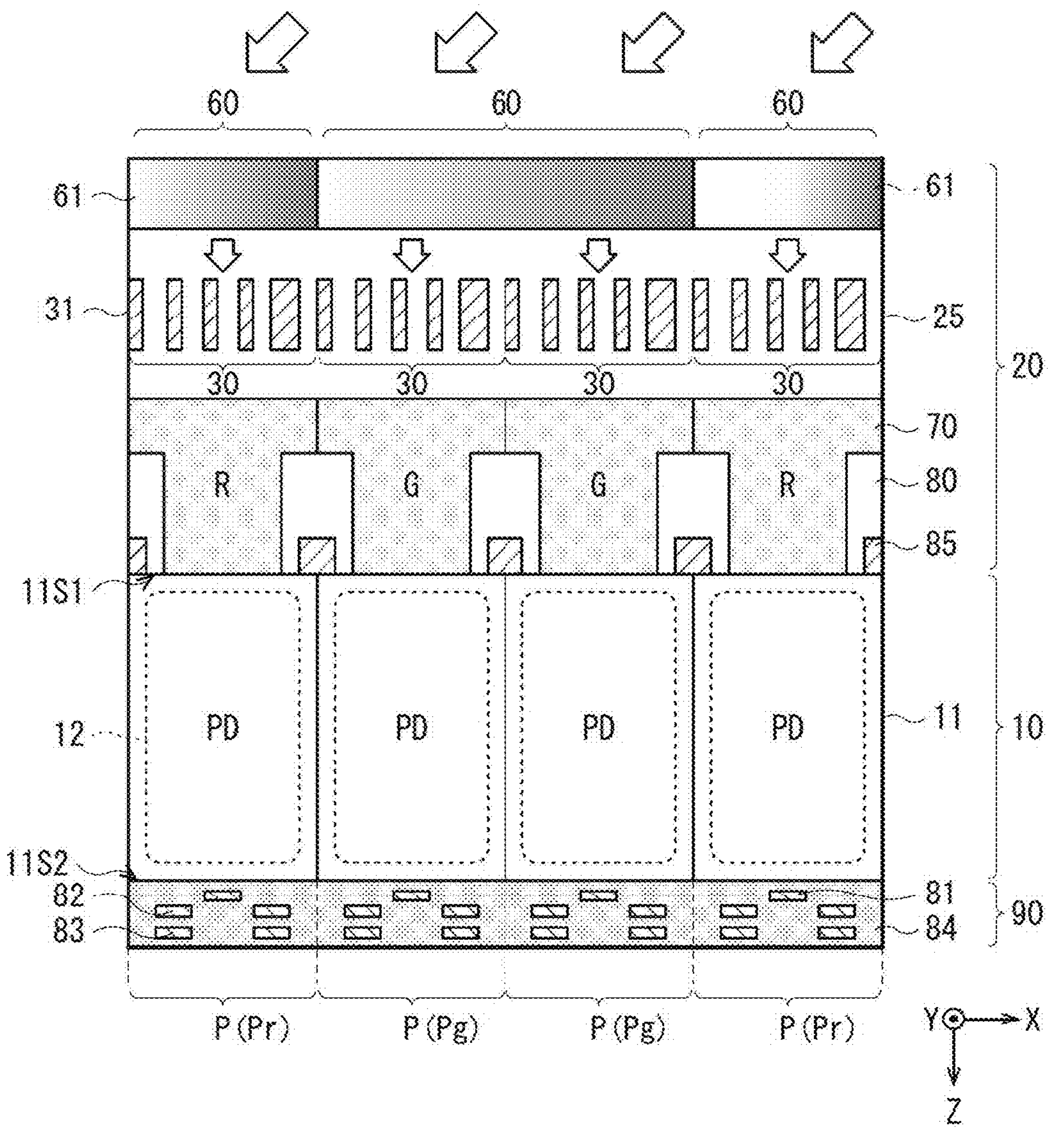

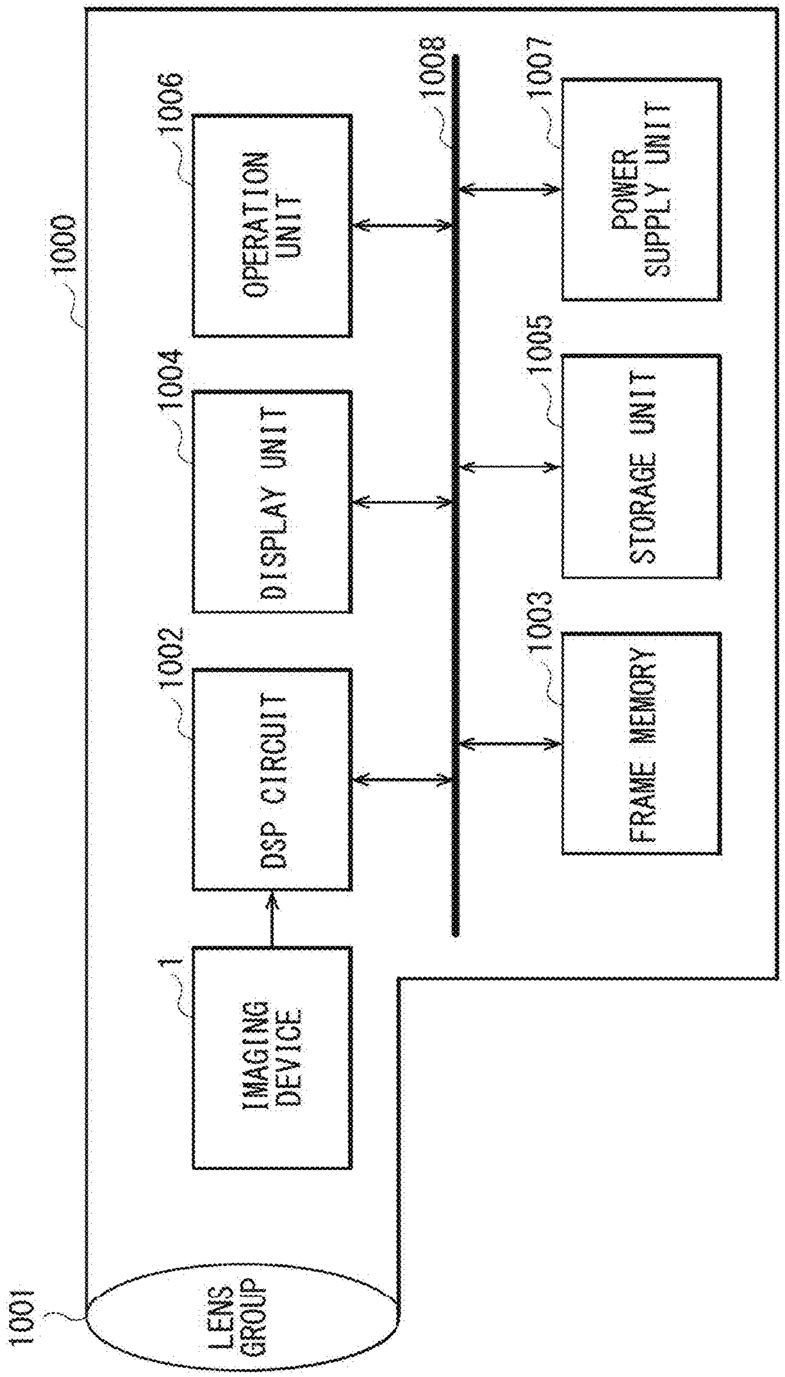
[FIG. 19]

[FIG. 20]
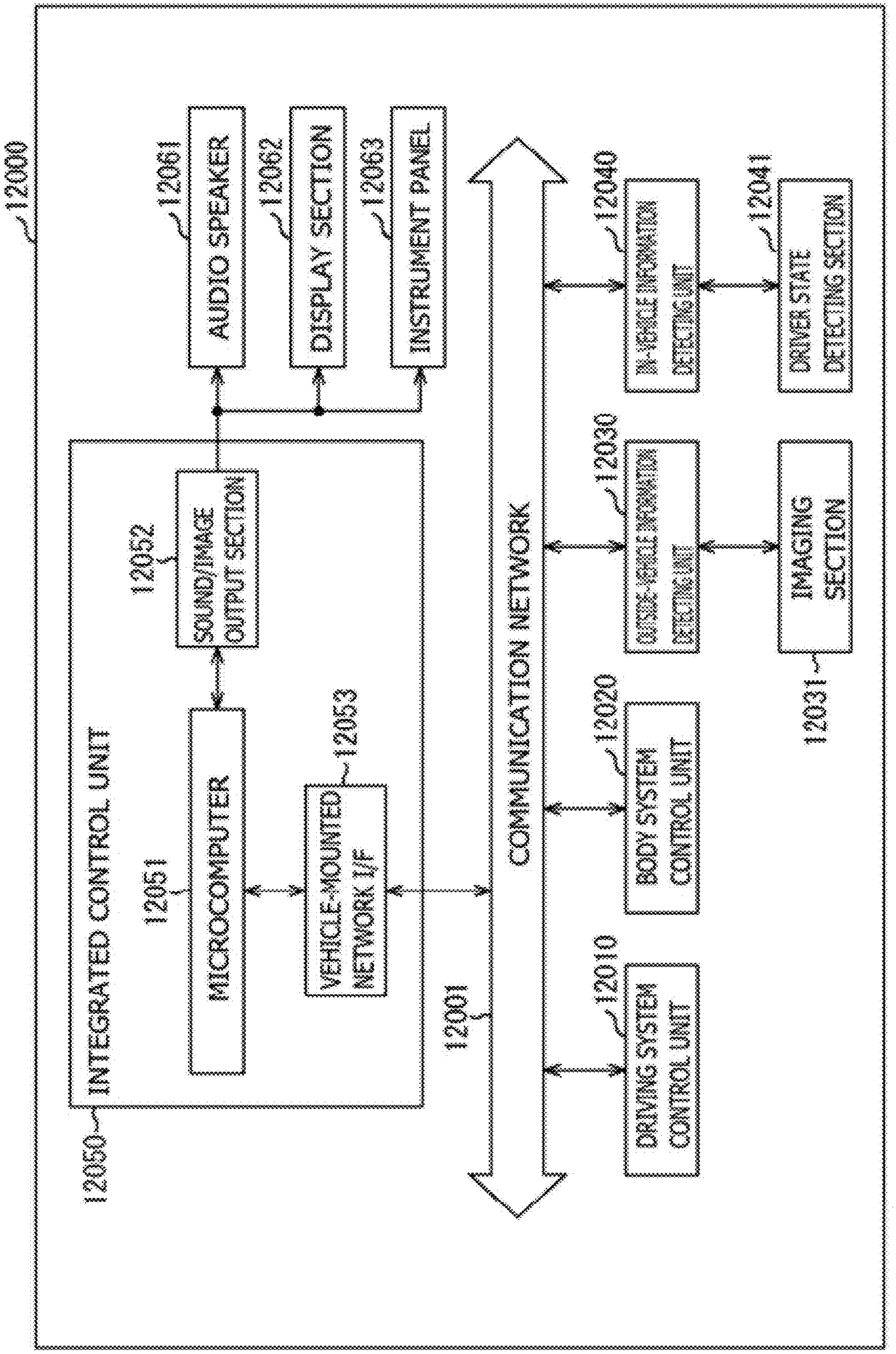

[ FIG. 21 ]
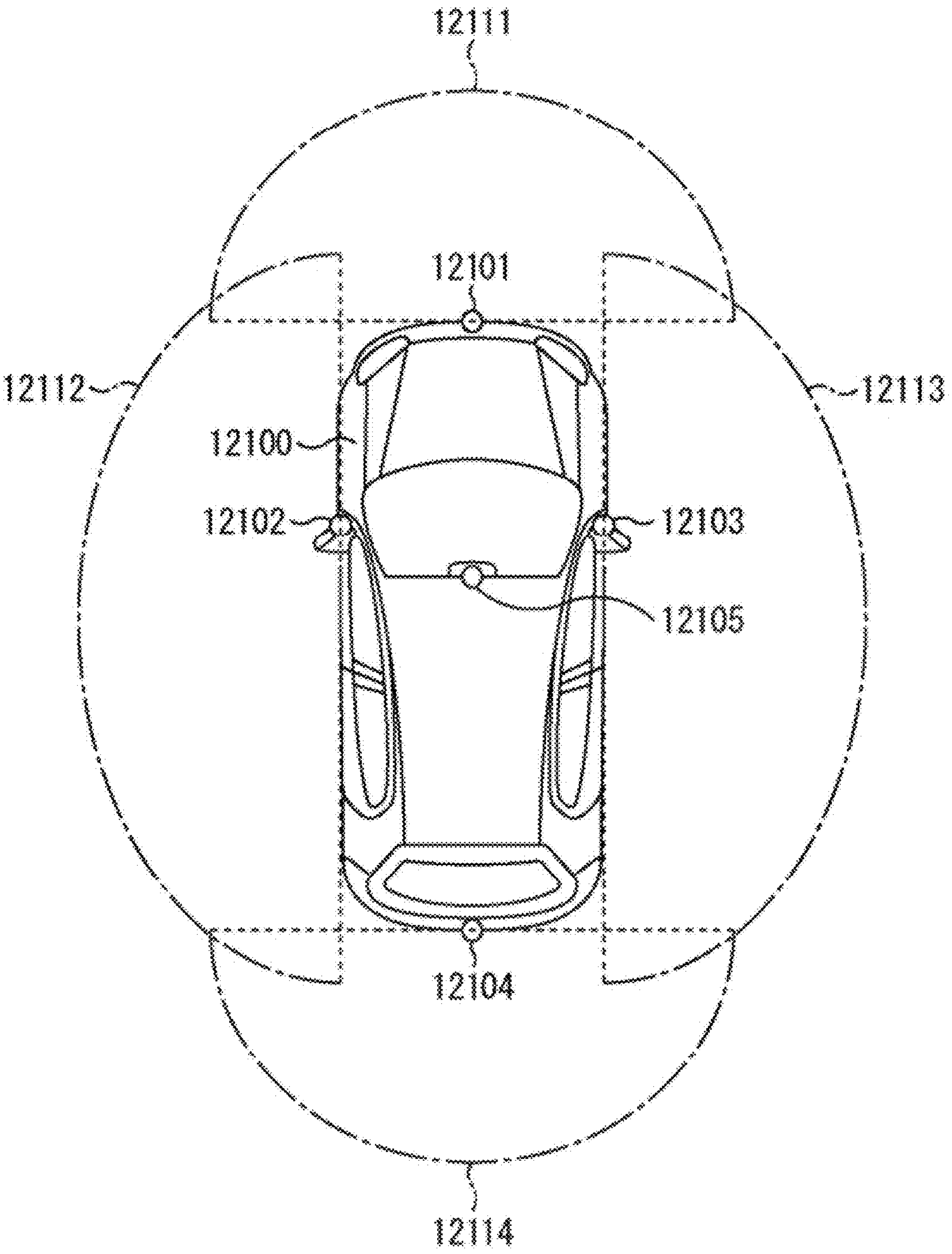

[FIG. 22]
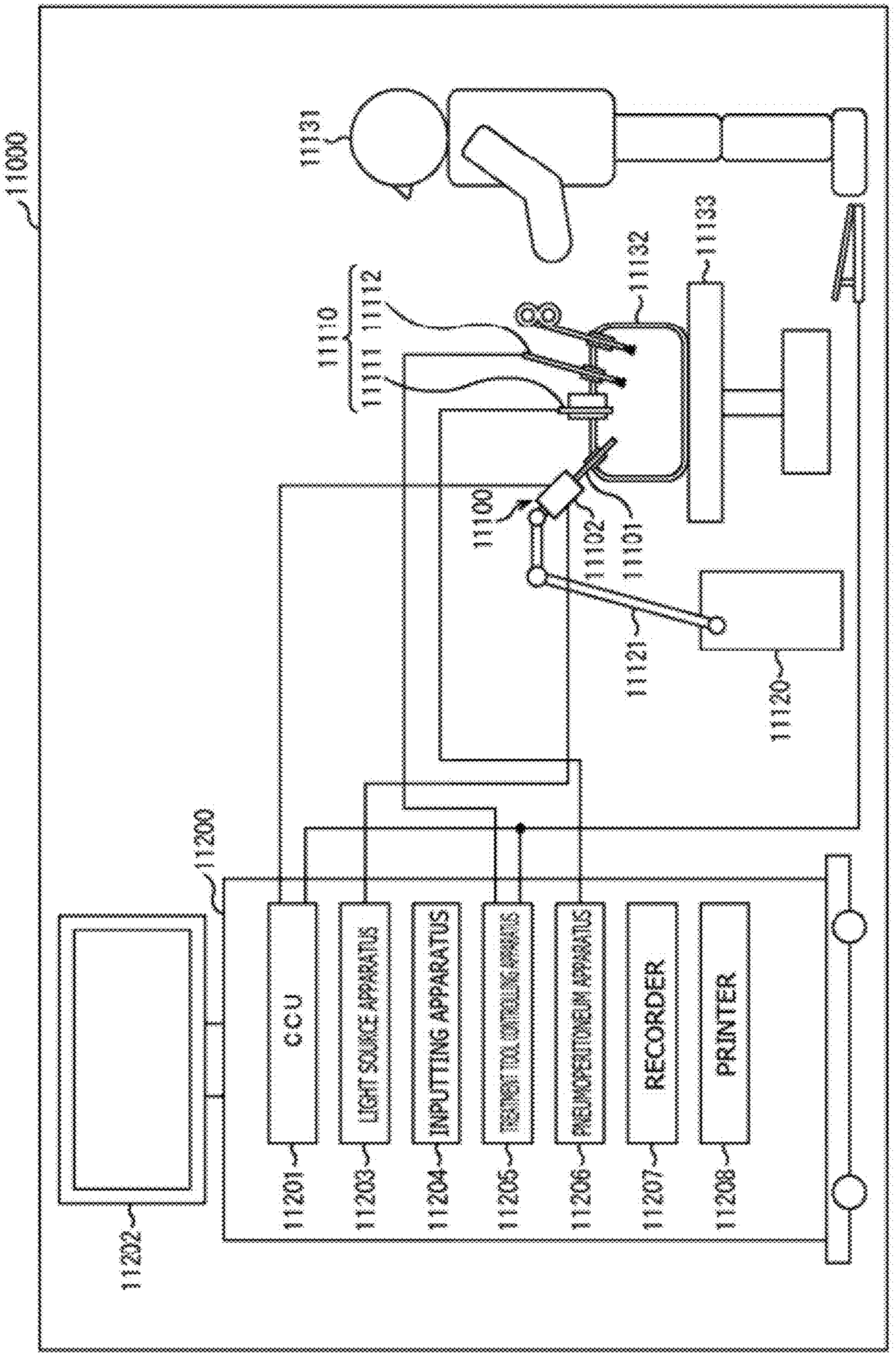

[ FIG. 23 ]
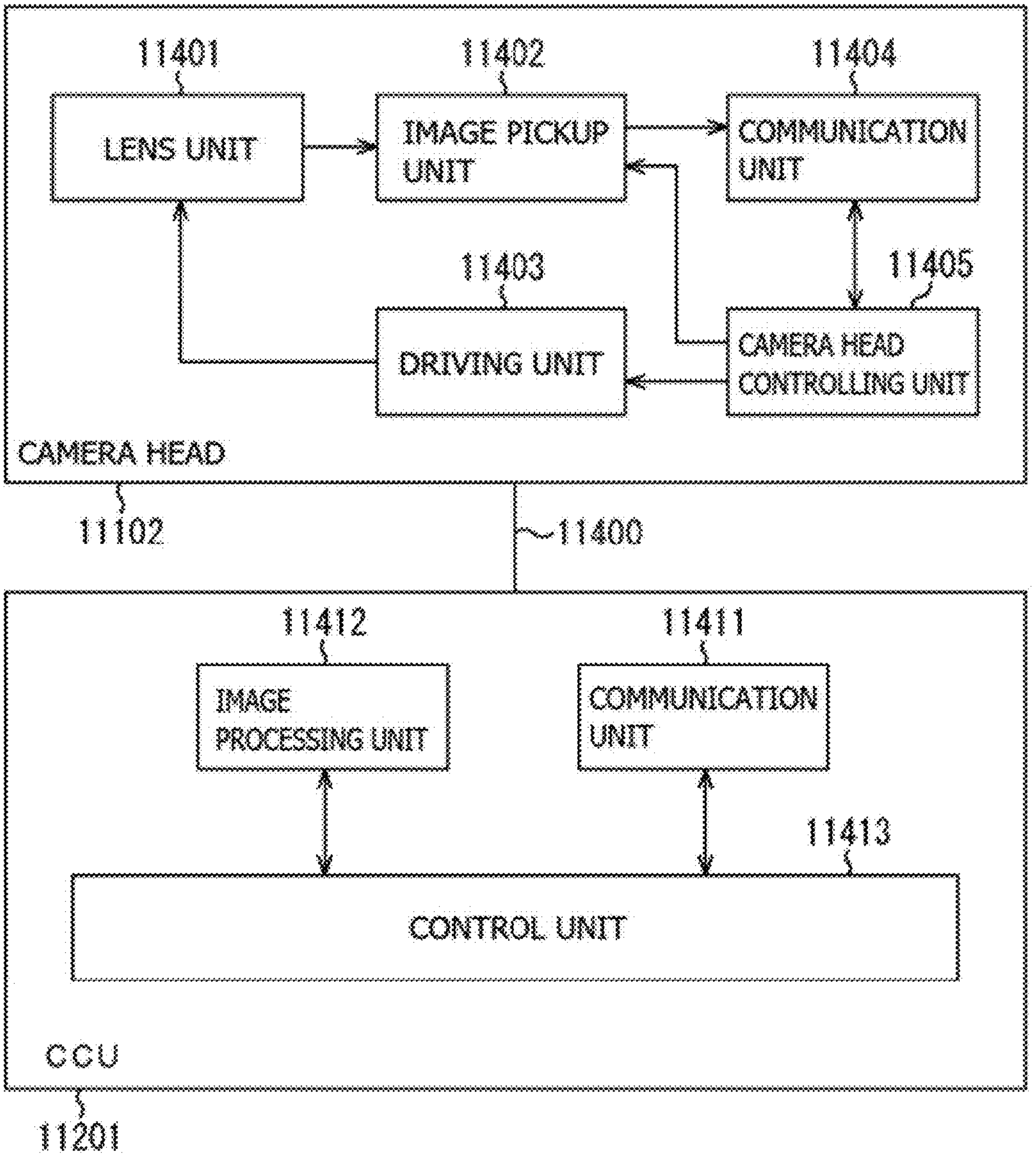

IMAGING DEVICE

CROSS REFERENCE TO RELATED APPLICATIONS

This application is a U.S. National Phase of International Patent Application No. PCT/JP2022/027991 filed on Jul. 19, 2022, which claims priority benefit of Japanese Patent Application No. JP 2021-129695 filed in the Japan Patent Office on Aug. 6, 2021. Each of the above-referenced applications is hereby incorporated herein by reference in its entirety.

TECHNICAL FIELD

The present disclosure relates to an imaging device.

BACKGROUND ART

There has been proposed an imaging device that obtains a signal corresponding to a color component by means of a spectral separation device including multiple columnar structures (PTL 1).

CITATION LIST

Patent Literature

PTL 1: Japanese Unexamined Patent Application Publication No. 2020-123964

SUMMARY OF INVENTION

An imaging device is expected to improve its characteristics for light that enters obliquely.

It is desirable to provide an imaging device that makes it possible to improve the characteristics for obliquely incident light.

An imaging device as an embodiment of the present disclosure includes a light separator, a first pixel, a second pixel, and a light shielding unit. The light separator separates first wavelength light included in a first wavelength region and second wavelength light included in a second wavelength region from incident light. The light separator includes a structure whose size is equal to or less than a wavelength of incident light. The first pixel includes a first photoelectric converter that selectively receives the first wavelength light and performs photoelectric conversion on the first wavelength light. The second pixel is adjacent to the first pixel and includes a second photoelectric converter that selectively receives the second wavelength light and performs photoelectric conversion on the second wavelength light. The light shielding unit blocks incident light. The light shielding unit is provided at a boundary between the first pixel and the second pixel.

BRIEF DESCRIPTION OF DRAWINGS

FIG. 1 is a block diagram illustrating an example of an overall configuration of an imaging device according to a first embodiment of the present disclosure.

FIG. 2 is a diagram illustrating an example of a planar configuration of the imaging device according to the first embodiment of the present disclosure.

FIG. 3 is a diagram illustrating an example of a cross-sectional configuration of the imaging device according to the first embodiment of the present disclosure.

FIG. 4 is a diagram illustrating an example of the planar configuration of part of the imaging device according to the first embodiment of the present disclosure.

FIG. 5A is a diagram illustrating an example of the cross-sectional configuration of the imaging device according to the first embodiment of the present disclosure in a position of a different image height.

FIG. 5B is a diagram illustrating an example of the cross-sectional configuration of the imaging device according to the first embodiment of the present disclosure in a position of a different image height.

FIG. 6A is a diagram illustrating an example of a cross-sectional configuration of an imaging device according to Modification Example 1 of the present disclosure.

FIG. 6B is a diagram illustrating an example of the cross-sectional configuration of the imaging device according to Modification Example 1 of the present disclosure.

FIG. 7 is a diagram illustrating an example of a cross-sectional configuration of an imaging device according to Modification Example 2 of the present disclosure.

FIG. 8 is a diagram illustrating an example of a planar configuration of an imaging device according to Modification Example 3 of the present disclosure.

FIG. 9 is a diagram illustrating an example of a cross-sectional configuration of the imaging device according to Modification Example 3 of the present disclosure.

FIG. 10A is a diagram illustrating an example of a cross-sectional configuration of an imaging device according to a second embodiment of the present disclosure in a position of a different image height.

FIG. 10B is a diagram illustrating an example of the cross-sectional configuration of the imaging device according to the second embodiment of the present disclosure in a position of a different image height.

FIG. 10C is a diagram illustrating an example of the cross-sectional configuration of the imaging device according to the second embodiment of the present disclosure in a position of a different image height.

FIG. 11A is a diagram illustrating an example of a cross-sectional configuration of an imaging device according to Modification Example 4 of the present disclosure.

FIG. 11B is a diagram illustrating an example of the cross-sectional configuration of the imaging device according to Modification Example 4 of the present disclosure.

FIG. 11C is a diagram illustrating an example of the cross-sectional configuration of the imaging device according to Modification Example 4 of the present disclosure.

FIG. 12A is a diagram illustrating another example of the cross-sectional configuration of the imaging device according to Modification Example 4 of the present disclosure.

FIG. 12B is a diagram illustrating another example of the cross-sectional configuration of the imaging device according to Modification Example 4 of the present disclosure.

FIG. 12C is a diagram illustrating another example of the cross-sectional configuration of the imaging device according to Modification Example 4 of the present disclosure.

FIG. 13 is a diagram illustrating an example of a cross-sectional configuration of an imaging device according to a third embodiment of the present disclosure.

FIG. 14 is a diagram illustrating an example of a planar configuration of an imaging device according to Modification Example 5 of the present disclosure.

FIG. 15 is a diagram illustrating another example of the planar configuration of the imaging device according to Modification Example 5 of the present disclosure.

FIG. 16 is a diagram illustrating an example of a cross-sectional configuration of an imaging device according to a fourth embodiment of the present disclosure.

FIG. 17A is a diagram illustrating an example of a planar configuration of a deflector according to the fourth embodiment of the present disclosure.

FIG. 17B is a diagram illustrating another example of the planar configuration of the deflector according to the fourth embodiment of the present disclosure.

FIG. 17C is a diagram illustrating another example of the planar configuration of the deflector according to the fourth embodiment of the present disclosure.

FIG. 17D is a diagram illustrating another example of the planar configuration of the deflector according to the fourth embodiment of the present disclosure.

FIG. 18 is a diagram illustrating an example of a cross-sectional configuration of an imaging device according to Modification Example 6 of the present disclosure.

FIG. 19 is a block diagram illustrating a configuration example of an electronic apparatus including the imaging device.

FIG. 20 is a block diagram depicting an example of schematic configuration of a vehicle control system.

FIG. 21 is a diagram of assistance in explaining an example of installation positions of an outside-vehicle information detecting section and an imaging section.

FIG. 22 is a view depicting an example of a schematic configuration of an endoscopic surgery system.

FIG. 23 is a block diagram depicting an example of a functional configuration of a camera head and a camera control unit (CCU).

MODES FOR CARRYING OUT THE INVENTION

With reference to the drawings, embodiments of the present disclosure will be described in detail below. It is to be noted that the description will be given in the following order.

1. First Embodiment
2. Second Embodiment
3. Third Embodiment
4. Fourth Embodiment
5. Application Example
6. Practical Application Examples

1. First Embodiment

FIG. 1 is a block diagram illustrating an example of an overall configuration of an imaging device (an imaging device 1) according to a first embodiment of the present disclosure. FIG. 2 is a diagram illustrating an example of a planar configuration of the imaging device 1. The imaging device 1 is, for example, a complementary metal-oxide semiconductor (CMOS) image sensor.

In the imaging device 1, pixels Peach including a photoelectric converter are arranged in a matrix. As illustrated in FIG. 2, the imaging device 1 includes, as an imaging area, a region (a pixel section 100) of a plurality of pixels P arranged two-dimensionally in a matrix. The imaging device 1 is able to be used in an electronic apparatus such as a digital still camera or a video camera. It is to be noted that, as illustrated in FIG. 2, an incident direction of light from a subject is referred to as a Z-axis direction, a right-and-left direction on the plane of paper perpendicular to the Z-axis direction is referred to as an X-axis direction, and an up-and-down direction on the plane of paper perpendicular to the Z-axis and the X-axis is referred to as a Y-axis direction. In the subsequent drawings, the direction may sometimes be represented with reference to a direction of an arrow in FIG. 2.

[Schematic Configuration of Imaging Device]

The imaging device 1 takes in incident light (image light) from a subject through an optical lens system (not illustrated). The imaging device 1 captures an image of the subject. The imaging device 1 converts an amount of incident light formed as an image on an imaging plane into an electrical signal on a pixel-by-pixel basis, and outputs the electrical signal as a pixel signal. The imaging device 1 includes the pixel section 100 as an imaging area. Furthermore, the imaging device 1 includes, in a region around the pixel section 100, for example, a vertical drive circuit 111, a column signal processing circuit 112, a horizontal drive circuit 113, an output circuit 114, a control circuit 115, an input-output terminal 116, etc.

In the pixel section 100, a plurality of pixels P is two-dimensionally arranged in a matrix. The pixel section 100 is provided with multiple pixel rows including a plurality of pixels P arranged in a horizontal direction (a lateral direction on the plane of paper) and multiple pixel columns including a plurality of pixels P arranged in a vertical direction (a longitudinal direction on the plane of paper).

In the pixel section 100, for example, a pixel drive line Lread (a row selection line and a reset control line) is provided for each pixel row, and a vertical signal line Lsig is provided for each pixel column. The pixel drive line Lread is for transmitting a drive signal for readout of a signal from a pixel. One end of the pixel drive line Lread is coupled to a corresponding output terminal of each pixel row of the vertical drive circuit 111.

The vertical drive circuit 111 includes a shift register, an address decoder, etc. The vertical drive circuit 111 is a pixel drive unit that drives each pixel P in the pixel section 100, for example, on a row-by-row basis. The column signal processing circuit 112 includes an amplifier, a horizontal selection switch, etc. provided for each vertical signal line Lsig. A signal output from each pixel P of a pixel row selected and scanned by the vertical drive circuit 111 is supplied to the column signal processing circuit 112 through a vertical signal line Lsig.

The horizontal drive circuit 113 includes a shift register, an address decoder, etc., and drives each horizontal selection switch of the column signal processing circuit 112 in turns while scanning. By this selective scanning by the horizontal drive circuit 113, a signal of each pixel transmitted through each of vertical signal lines Lsig is output to a horizontal signal line 121 in turns, and is transmitted to the outside of a semiconductor substrate 11 through the horizontal signal line 121.

The output circuit 114 performs signal processing on signals sequentially supplied from each of the column signal processing circuits 112 through the horizontal signal line 121 and outputs the processed signals. For example, the output circuit 114 sometimes performs only buffering, and sometimes performs black level adjustment, column variation correction, a variety of digital signal processing, etc.

A circuit part including the vertical drive circuit 111, the column signal processing circuit 112, the horizontal drive circuit 113, the horizontal signal line 121, and the output circuit 114 may be formed on the semiconductor substrate 11, or may be provided in an external control IC. Furthermore, the circuit part of those may be formed on another substrate coupled by a cable or something.

The control circuit 115 receives a clock given from the outside of the semiconductor substrate 11, data commanding an operation mode, etc., and outputs data such as internal information of the imaging device 1. Furthermore, the control circuit 115 includes a timing generator that generates various timing signals, and performs control of driving peripheral circuits including the vertical drive circuit 111, the column signal processing circuit 112, the horizontal drive circuit 113, etc. on the basis of the various timing signals generated by the timing generator. The input-output terminal 116 exchanges a signal with the outside.

[Configuration of Pixel]

FIG. 3 is a diagram illustrating an example of a cross-sectional configuration of the imaging device 1. For example, the imaging device 1 has a configuration in which a light receiving unit 10, a light guiding unit 20, and a multi-layer wiring layer 90 are stacked in layers. The light receiving unit 10 includes the semiconductor substrate 11 having first and second surfaces 11S1 and 11S2 opposed to each other. The light guiding unit 20 is provided on the side of the first surface 11S1 of the semiconductor substrate 11, and the multi-layer wiring layer 90 is provided on the side of the second surface 11S2 of the semiconductor substrate 11. It may be said that the light guiding unit 20 is provided on the side from which light from the optical lens system enters, and the multi-layer wiring layer 90 is provided on the side opposite to the side from which light enters. The imaging device 1 is a so-called back-illuminated imaging device.

The semiconductor substrate 11 includes, for example, a silicon substrate. A photoelectric converter 12 is, for example, a photodiode (PD), and forms a p-n junction with a predetermined region of the semiconductor substrate 11. The semiconductor substrate 11 is embedded with a plurality of the photoelectric converters 12. In the light receiving unit 10, the plurality of photoelectric converters 12 is provided along the first and second surfaces 11S1 and 11S2 of the semiconductor substrate 11.

The multi-layer wiring layer 90 has, for example, a configuration in which multiple wiring layers 81, 82, and 83 are stacked with an interlayer insulating layer 84 between them. In the semiconductor substrate 11 and the multi-layer wiring layer 90, a circuit (for example, a transfer transistor, a reset transistor, an amplification transistor, etc.) for reading a pixel signal based on an electric charge generated by the photoelectric converter 12 is formed. Furthermore, in the semiconductor substrate 11 and the multi-layer wiring layer 90, for example, the vertical drive circuit 111, the column signal processing circuit 112, the horizontal drive circuit 113, the output circuit 114, the control circuit 115, the input-output terminal 116, etc. described above are formed.

The wiring layers 81, 82, and 83 are formed, for example, using a material such as aluminum (Al), copper (Cu), or tungsten (W). Besides these, the wiring layers 81, 82, and 83 may be formed using polysilicon (poly-Si). The interlayer insulating layer 84 is formed of, for example, a single-layer film including, of silicon oxide ($SiO_x$), TEOS, silicon nitride ($SiN_x$), silicon oxynitride ($SiO_xN_y$), and the like, one type or a multi-layered film including two or more types of those.

The light guiding unit 20 includes a transparent layer 25 and a light separator 30, and guides light that has entered toward the light receiving unit 10 side. The transparent layer 25 is a transparent layer that allows light to pass therethrough, and is formed using a material having a low refractive index, such as silicon oxide ($SiO_x$) or silicon nitride ($SiN_x$). The light guiding unit 20 including the light separator 30 is stacked on the light receiving unit 10 in a thickness direction perpendicular to the first surface 11S1 of the semiconductor substrate 11. It is to be noted that the imaging device 1 may be provided with a lens unit (an on-chip lens) that concentrates light. This lens unit is provided on the side from which light enters, for example, above the light separator 30.

The light separator 30 includes one or more structures 31, and separates light that has entered. The structure 31 is a minute (micro-) structure whose size is equal to or less than a predetermined wavelength of incoming light. It is to be noted that in FIGS. 3 and 4, a first structure 31*a* and a second structure 31*b* are illustrated as an example of the structures 31. In the present specification, the first structure 31*a* and the second structure 31*b* may be collectively described as the structures 31. The structures 31 have a size that is, for example, equal to or less than a wavelength of visible light. For example, the light separator 30 is provided for every multiple pixels P. In the example illustrated in FIGS. 3 and 4, the light separator 30 is provided for every three pixels P.

The structures 31 have a refractive index higher than those of their surrounding media. The surrounding media include silicon oxide ($SiO_x$), air (an air gap), etc. In the present embodiment, the structures 31 include a material having a refractive index higher than a refractive index of the transparent layer 25. The structures 31 are formed, for example, using silicon nitride ($SiN_x$).

The light separator 30 causes a phase delay in incoming light by a difference in the refractive index between the structure 31 and the surrounding medium to affect a wavefront. In the light separator 30, a propagation direction of light varies according to wavelength region due to the occurrence of a different amount of phase delay according to the wavelength of light. This enables the light separator 30 to separate light that has entered into pieces of light of respective wavelength regions. The light separator 30 is a spectral separation device that separates light by means of a metamaterial (metasurface) technology. It may be said that the light separator 30 is a region (a spectral separation region) in which incident light is separated by the structures 31.

In the example illustrated in FIGS. 3 and 4, the light separator 30 includes the first structure 31*a* and the second structure 31*b*. The first structure 31*a* and the second structure 31*b* are both a columnar (pillar-like) structure, and are provided in the transparent layer 25. The first structure 31*a* and the second structure 31*b* are disposed to be aligned in the right-and-left direction on the plane of paper (the X-axis direction) with a part of the transparent layer 25 between them. The first structure 31*a* and the second structure 31*b* may be disposed to be kept at a distance of a predetermined wavelength of incoming light or less, for example, a wavelength of visible light or less.

The first structure 31*a* and the second structure 31*b* are formed to be different from each other in size, shape, refractive index, or something. In the example illustrated in FIG. 3, the first structure 31*a* and the second structure 31*b* are formed to have different sizes from each other to form a stepped shape. This makes it possible for the light separator 30 to cause different phase delays of, of light that has entered, pieces of light of first to third wavelength regions and separate the light into light of the first wavelength region, light of the second wavelength region, and light of the third wavelength region.

The size, shape, refractive index, etc. of each of the structures 31 are set to cause pieces of light of the respective wavelength regions included in incident light to diverge and travel in desired directions. It is to be noted that the first structure 31*a* and the second structure 31*b* may include the same material, or may include different materials.

As schematically illustrated in FIG. 3, for example, the light separator 30 propagates, of incident light, green (G) light to the photoelectric converter 12 of the middle pixel P (a pixel Pg). Furthermore, the light separator 30 propagates, of incident light, blue (B) light to the photoelectric converter 12 of the pixel P (a pixel Pb) on the left of the pixel Pg and red (R) light to the photoelectric converter 12 of the pixel P (a pixel Pr) on the right of the pixel Pg. This enables the respective photoelectric converters 12 of the pixels Pr, Pg, and Pb to receive pieces of light of different wavelength regions from one another.

The pixel Pr is able to selectively receive red (R) wavelength light and photoelectrically convert it. Furthermore, the pixel Pg is able to selectively receive green (G) wavelength light and photoelectrically convert it, and the pixel Pb is able to selectively receive blue (B) wavelength light and photoelectrically convert it. The pixels Pr, Pg, and Pb generate a pixel signal of an R component, a pixel signal of a G component, and a pixel signal of a B component, respectively. The imaging device 1 is able to obtain the R, G, and B pixel signals.

A light shielding unit 40 illustrated in FIGS. 3 and 4 includes a member that blocks light, and is provided at a boundary between adjacent pixels P. In the example illustrated in FIG. 3, the light shielding units 40 are provided, within the transparent layer 25, around the light separator 30. In FIG. 3, the light shielding units 40 are provided at a boundary between the pixels Pb and Pg and a boundary between the pixels Pg and Pr. The light shielding unit 40 is, for example, a member (a light guiding member) that guides light that has entered.

As illustrated in FIGS. 3 and 4, the light shielding units 40 are provided, for example, to surround the light separator 30 within the transparent layer 25. The light shielding unit 40 is formed into a lattice shape, and is provided at a boundary between adjacent pixels P.

FIGS. 5A and 5B are diagrams illustrating an example of the cross-sectional configuration of the imaging device 1 in a position of a different image height. FIG. 5A illustrates a region where the distance from the center of the pixel section 100 (or the light receiving unit 10) (the distance from an optical axis of the optical lens system of the imaging device 1) is short, i.e., a region where the image height is low. FIG. 5B illustrates a region where the image height is high.

In a position where the image height is high, light that has passed through the optical lens system obliquely enters the imaging device 1. That is, light from a subject enters at a large angle of incidence. Such obliquely incident light is assumed to enter with a deviation from the light separator 30 in an X direction. Thus, in the present embodiment, the light shielding units 40 that are a light guiding member are provided near the light separator 30. As schematically illustrated with a bold line in FIG. 5B, obliquely incident light that has entered the light shielding unit 40 is guided toward the light separator 30 side.

[Action and Effect]

The imaging device 1 according to the present embodiment includes the light separator 30, the pixels Peach including the photoelectric converter 12, and the light shielding unit 40. The light separator 30 includes the structures 31 whose sizes are equal to or less than a wavelength of incident light, and separates first wavelength light (for example, red (R) light) included in the first wavelength region and second wavelength light (for example, green (G) light) included in the second wavelength region from incident light. The photoelectric converter 12 receives the separated light from light separator 30 and performs photoelectric conversion on the received light. The light shielding unit 40 is provided at a boundary between adjacent pixels P, and block incident light.

In the imaging device 1, spectral separation is performed by the light separator 30 including the minute structures 31. Thus, as compared with a case of using a color filter that absorbs light to obtain R, G, and B pixel signals, it is possible to increase the amount of light that enters the photoelectric converter 12. Also in a case where the loss of light is reduced, and the refinement of pixels has progressed, it is possible to improve the sensitivity to incident light. It is possible to improve the light use efficiency.

In a columnar structure, a desired phase delay is not able to be obtained in a case of obliquely incident light, and the accuracy of spectral separation may be worsened. Meanwhile, in the imaging device 1 according to the present embodiment, the light shielding units 40 are provided around the light separator 30 including the structures 31. Thus, it is possible to prevent unwanted obliquely incident light from directly entering the light separator 30 and prevent the worsening of characteristics for the case of obliquely incident light. It is possible to suppress the leakage of unwanted light to the surroundings (the photoelectric converter 12, etc.) and suppress the occurrence of mixing of colors.

Subsequently, modification examples of the present disclosure are described. In the following, a similar component to the above-described embodiment is assigned the same reference numeral, and its description is omitted accordingly.

1-1. Modification Example 1

FIGS. 6A and 6B are diagrams illustrating an example of a cross-sectional configuration of the imaging device 1 according to Modification Example 1. FIG. 6A illustrates a region where the image height is low, and FIG. 6B illustrates a region where the image height is high. In the present modification example, the light shielding unit 40 includes a member (an absorbent member) that absorbs a portion of light to the photoelectric converter 12. The light shielding unit 40 includes, for example, an absorber such as carbon black, and has a characteristic of absorbing light that has entered.

The imaging device 1 according to the present modification example includes the light shielding units 40 that absorb light that has entered. Thus, as schematically illustrated in FIG. 6B, a portion of obliquely incident light is absorbed by the light shielding units 40 that are an absorbent member. Therefore, it is possible to suppress the leakage of unwanted light to the surroundings.

It is to be noted that a member (a reflective member) that reflects light that has entered may be provided as the light shielding unit 40. The light shielding unit 40 includes, for example, a material such as aluminum (Al), tungsten (W), gold (Au), or silver (Ag). In this case, a portion of obliquely incident light is reflected by the light shielding units 40, and thus it is possible to suppress unwanted light entering the photoelectric converter 12, etc.

1-2. Modification Example 2

FIG. 7 is a diagram illustrating an example of a cross-sectional configuration of the imaging device 1 according to Modification Example 2. In the present modification example, the light shielding units 40 are provided to cover the region surrounding the photoelectric converters 12 within the transparent layer 25. The light shielding units 40 include, for example, the above-described light guiding member. In the present modification example, by means of the light shielding units 40 provided around the photoelectric converters 12, it becomes possible to suppress the leakage of unwanted light to the photoelectric converter 12, etc. It is to be noted that the above-described absorbent member or reflective member may be provided as the light shielding unit 40.

1-3. Modification Example 3

In the above-described embodiment, there is described an example where the light separator 30 includes two minute structures; however, the number and disposition of minute structures are not limited to this. FIG. 8 is a diagram illustrating an example of a planar configuration of the imaging device 1 according to Modification Example 3. FIG. 9 is a diagram illustrating an example of a cross-sectional configuration of the imaging device 1 according to Modification Example 3.

The second structure 31*b* is provided in the middle of each pixel P. A plurality of the first structures 31*a* is provided to surround the second structure 31*b*. The size (height and width) of the second structure 31*b* is larger than the size of the first structure 31*a*. In this case, the light separator 30 is able to separate light that has entered according to wavelength region and concentrate the separated light. As schematically illustrated in FIG. 9, the light separator 30 is able to concentrate, for example, of incident light, green (G) light to the photoelectric converter 12 of the middle pixel Pg and concentrate red (R) light to the right and left pixels Pr.

2. Second Embodiment

Subsequently, a second embodiment of the present disclosure is described. In the following, a similar component to the above-described embodiment is assigned the same reference numeral, and its description is omitted accordingly.

FIGS. 10A, 10B, and 10C are diagrams illustrating an example of a cross-sectional configuration of the imaging device 1 in a position of a different image height. FIG. 10A illustrates a region near the center of the pixel section 100 (or the light receiving unit 10), i.e., a region where the image height is substantially zero. FIG. 10B illustrates a region where the image height is higher than that of the case of FIG. 10A. FIG. 10C illustrates a region where the image height is higher than that of the case of FIG. 10B.

Into the middle part of the pixel section 100 of the imaging device 1, light from the optical lens system enters almost vertically. Meanwhile, into the peripheral part located on the outer side than the middle part, i.e., a region far from the middle of the pixel section 100, light enters obliquely. Thus, in the present embodiment, the structures 31 of each light separator 30 are configured to differ in the number, position, size, etc. depending on the distance from the center of the pixel section 100 (the light receiving unit 10). Thus, it is possible to perform spectral separation in response to obliquely incident light.

In the example illustrated in FIGS. 10A, 10B, and 10C, the light separator 30 is provided with the structures 31 that differ in height according to the image height. In the light separator 30 provided for each pixel P (in FIGS. 10A, 10B, and 10C, a light separator 30*g* provided for a pixel Pg, a light separator 30*b* provided for a pixel Pb), the higher the image height, the gradually shorter (lower) the height of the structure 31. Furthermore, to obtain desired spectral characteristics for each of R, G, and B pixels, the structures 31 differ in height and width according to the R, G, and B pixels.

[Action and Effect]

The imaging device 1 according to the present embodiment includes the light receiving unit 10 and the light separator 30. The light receiving unit 10 is provided with, along the first surface 11S1, a plurality of the photoelectric converters 12 that each generate an electric charge through photoelectric conversion. The light separator 30 is stacked on the light receiving unit 10 in the thickness direction perpendicular to the first surface 11S1. The light separator 30 is provided with the structures 31 that vary depending on the distance from the center of the light receiving unit 10, and separate incident light.

In the imaging device 1, spectral separation is performed by the light separator 30 provided with the structures 31 that vary depending on the distance from the center of the light receiving unit 10. Thus, even in a case where light enters obliquely, it is possible to appropriately separate incoming light and cause the separated light to propagate to the photoelectric converter 12. It is possible to suppress the decline of the spectral characteristics for the case of obliquely incident light.

It is to be noted that the imaging device 1 of the present embodiment may be configured to be combined with the above-described first embodiment. For example, the above-described light shielding unit 40 (a light guiding member, an absorbent member, or a reflective member) may be provided between the adjacent light separators 30.

Subsequently, a modification example of the present disclosure is described. In the following, a similar component to the above-described embodiment is assigned the same reference numeral, and its description is omitted accordingly.

2-1. Modification Example 4

FIGS. 11A, 11B, and 11C are diagrams illustrating an example of a cross-sectional configuration of the imaging device 1 according to Modification Example 4. In the above-described embodiment, there is described an example where structures that differ in height according to the image height are provided; however, structures having different refractive indices according to the image height may be provided. There is a tendency that if the refractive index is high, a phase delay is large; if the refractive index is low, a phase delay is small. Thus, in the light separator 30, for example, the refractive index of the structure 31 on the side of the center of the image height is set to be higher than the refractive index of the structure 31 on the outside of the image height.

In FIG. 11A, in each of the light separators 30*g* and 30*b*, multiple first structures 31*a* having a refractive index n1 are disposed side by side. In FIG. 11B, in the light separators 30*b*, the first structures 31*a* having the refractive index n1 as well as a second structure 31*b* having a refractive index n2 higher than the refractive index n1 are disposed.

In FIG. 11C, in the light separators 30*g*, the first structures 31*a* and a second structure 31*b* having the refractive index n2 are disposed. In the light separators 30*b*, more second structures 31*b* than in a case of FIG. 11B are disposed. In this way, the light separators 30 are provided with the structures 31 having a higher refractive index as the image height becomes higher.

The imaging device 1 according to the present modification example includes the light separators 30 provided with the structures 31 that differ in refractive index according to the image height. Thus, even in a case where light enters obliquely, it is possible to appropriately separate incoming light. It is possible to reduce the decline of the spectral characteristics.

It is to be noted that, as schematically illustrated in FIGS. 12A, 12B, and 12C, the structures 31 that differ in shape according to the image height may be provided. The structures 31 having different cross-sectional shapes with the increasing image height, for example, the structures 31 having a polygonal shape, a cross shape, an elliptical shape, etc. may be provided. Furthermore, the structures 31 may be disposed to cause their cross-sectional shape to be turned according to the image height.

3. Third Embodiment

Subsequently, a third embodiment of the present disclosure is described. In the following, a similar component to the above-described embodiments is assigned the same reference numeral, and its description is omitted accordingly.

FIG. 13 is a diagram illustrating an example of a cross-sectional configuration of the imaging device 1. In the present embodiment, the light guiding unit 20 includes a deflector 50. The deflector 50 includes a structure 51, and deflects light that has entered. The structure 51 is a minute structure whose size is equal to or less than a predetermined wavelength of incoming light. The structure 51 has a refractive index higher than those of its surrounding media. The media surrounding the structure 51 include air (an air gap), silicon oxide ($SiO_x$), etc. In the present embodiment, the structure 51 includes a material having a refractive index higher than a refractive index of the air.

The deflector 50 is provided on top of the light separator 30 in a direction in which light enters. The deflector 50 causes a phase delay in incoming light by a difference in the refractive index between the structure 51 and its surrounding media. In the deflector 50, a propagation direction of light that has entered varies due to the occurrence of the phase delay. Thus, the deflector 50 is able to change a traveling direction of light. The deflector 50 is a deflection device that deflects light using by means of the metamaterial technology. It may be said that the deflector 50 is a region (a deflection region) in which incident light is deflected by the structure 51.

In the example illustrated in FIG. 13, the deflector 50 includes columnar structures 51. The multiple columnar structures 51 are provided to be aligned in the X-axis direction, for example, with an air gap between them. The structures 51 are formed to have a size that is equal to or less than a wavelength of incident light, for example, equal to or less than a wavelength of visible light. Furthermore, for example, the structures 51 may have a size that is equal to or less than a wavelength of near-infrared light.

The light separator 30 is provided between the deflector 50 and the photoelectric converter 12, and includes the above-described multiple structures 31. Into the light separator 30, light that has passed through the deflector 50 enters. The light separator 30 separates the incident light according to wavelength region, and propagates the separated pieces of light toward the respective different photoelectric converters 12.

Into a pixel located, within an imaging device, in a region where the image height is high, light enters obliquely. In this case, if light enters obliquely a structure of a light separator, there is a possibility that it may fail to accurately separate the light. Thus, in the imaging device 1 according to the present embodiment, the deflector 50 is provided more on the light incident side than the light separator 30. Furthermore, the size of the structures 51 of each deflector 50, the space between the structures 51, etc. are configured to differ according to the image height. This makes it possible to cause obliquely incoming light to be deflected by the deflector 50 and cause the light to vertically enter the light separator 30. Therefore, it is possible for the light separator 30 to accurately perform spectral separation.

In the example illustrated in FIG. 13, the deflector 50 is provided with the structures 51 that differ in size according to the image height. In the deflectors 50 of each pixel P, the higher the image height, the gradually smaller the size (the cross-sectional area and the width) of the structure 51. Furthermore, the higher the image height, the gradually wider the space between the adjacent structures 51. It is to be noted that in a region where the image height is zero, the structures 51 of the deflector 50 have an equal size, and are disposed to be equally spaced apart.

[Action and Effect]

The imaging device 1 according to the present embodiment includes the deflector 50, the light separator 30, and the photoelectric converter 12. The deflector 50 includes the structures 51 whose size is equal to or less than the wavelength of incident light, and deflects light. The light separator 30 includes the structures 31 whose size is equal to or less than the wavelength of incident light, and separates light that has passed through the deflector 50. The photoelectric converter 12 photoelectrically converts light that has passed through the light separator 30.

In the imaging device 1, incident light is deflected by the deflector 50 and separated by the light separator 30. This makes it possible to change the traveling direction of light that has entered obliquely and cause the light to enter the light separator 30. Therefore, it is possible to suppress the decline of the spectral characteristics of the light separator 30 for the case of obliquely incident light. It is possible to accurately perform spectral separation and suppress the occurrence of mixing of colors.

Subsequently, a modification example of the present disclosure is described. In the following, a similar component to the above-described embodiment is assigned the same reference numeral, and its description is omitted accordingly.

3-1. Modification Example 5

FIG. 14 is a diagram illustrating an example of a planar configuration of the imaging device 1 according to Modification Example 5. FIG. 14 illustrates the structures 51 of the deflectors 50 in positions of the respective image heights of the pixel section 100 (the light receiving unit 10). As illustrated in FIG. 14, the deflector 50 includes a first structure 51*a* and second structures 51*b*, 51*c*, and 51*d* provided to surround the first structure 51*a*. The first structure 51*a* and the second structures 51*b*, 51*c*, and 51*d* each have a circular shape.

In the present modification example, as illustrated in FIG. 14, the respective structures 51 of the deflectors 50 are configured to differ in the disposition position according to the image height. In pixels P in the peripheral part of the pixel section 100, the first structure 51*a* and the second structures 51*b* and 51*c* deviate to the middle of the pixel section 100. In the deflectors 50 in the peripheral part, the center of the first structure 51*a* is located closer to the center of the pixel section 100 than the respective centers of the second structures 51*b*, 51*c*, and 51*d* are. Thus, even in a case where light enters obliquely, it is possible to appropriately deflect incoming light and perform spectral separation. Therefore, it is possible to suppress the occurrence of mixing of colors.

It is to be noted that the shape, the number, etc. of the structures 51 are not limited to the example illustrated. For example, the first structure 51*a* and the second structures 51*b*, 51*c*, and 51*d* may have a square shape like the one illustrated in FIG. 15, or may have some other shape.

4. Fourth Embodiment

Subsequently, a fourth embodiment of the present disclosure is described. In the following, a similar component to the above-described embodiments is assigned the same reference numeral, and its description is omitted accordingly.

FIG. 16 is a diagram illustrating an example of a cross-sectional configuration of the imaging device 1. The light guiding unit 20 includes a deflector 60, a color filter 70, a waveguide 80, and a light shielding unit 85. The color filter 70 selectively allows, of incoming light, light in a specific wavelength range to pass therethrough. The imaging device 1 is provided with pixels Pr provided with a color filter 70*r* that allows red (R) light to pass therethrough, pixels Pg provided with a color filter 70*g* that allows green (G) light to pass therethrough, and pixels Pb provided with a color filter 70*b* that allows blue (B) light to pass therethrough. In the pixel section 100 of the imaging device 1, the pixels Pr, Pg, and Pb are arranged in accordance with the Bayer layout.

The waveguide 80 is provided with the light shielding unit 85 that blocks light. The waveguide 80 guides light that has entered to the light shielding unit 85. The light shielding unit 85 includes, for example, a material that absorbs light, and absorbs light that has entered through the waveguide 80.

The deflector 60 includes a structure 61, and deflects light. It may be said that the deflector 60 is a region (a deflection region) in which incident light is deflected by the structure 61. The structure 61 is a minute structure sufficiently smaller than a predetermined wavelength of incoming light. For example, the structure 61 has a size that is equal to or less than one-fifth of a predetermined wavelength of incoming light or equal to or less than one-tenth of the predetermined wavelength of incoming light. Furthermore, a plurality of the structures 61 may be disposed at intervals of one-fifth of a predetermined wavelength of incident light or less or one-tenth of the predetermined wavelength of incident light or less. The structure 61 has a refractive index higher than those of its surrounding media. The media surrounding the structure 61 include air (an air gap), silicon oxide ($SiO_x$), etc.

The angle of incidence of light that has passed through the optical lens system into a pixel P varies depending on the distance from the center of the pixel section 100 (the light receiving unit 10), and there is a possibility that the photoelectric converter 12 of a pixel P far from the center of the pixel section 100 may fail to efficiently receive the incident light. Therefore, the deflector 60 according to the present embodiment is configured to cause the refractive index to gradually change according to the position within the deflector 60 by means of the multiple structures 61. The deflector 60 is configured to cause a difference between the refractive index at a position closest to the center of the pixel section 100 and the refractive index at a position farthest from the center of the pixel section 100 within the deflector 60 to differ according to the disposition position of the deflector 60 (i.e., the image height). For example, the deflector 60 is provided with the structures 61 that differ in size depending on the distance from the center of the pixel section 100. For example, the deflector 60 has a characteristic of the refractive index that gradually changes according to the position within the deflector 60. For example, the larger the angle of incidence of light into the deflector 60, i.e., the higher the image height the deflector 60 has, the larger the above-described difference between the maximum refractive index and the minimum refractive index within the deflector 60. The deflector 60 has a difference in the maximum refractive index depending on the angles of incidence and azimuth of light.

For example, as illustrated in FIG. 17A, the deflector 60 is configured to become higher in the density of holes that are the structures 61 from the left edge toward the right edge of the deflector 60. Furthermore, for example, as illustrated in FIG. 17B, the deflector 60 is configured to become larger in the size of holes that are the structures 61 from the left edge toward the right edge of the deflector 60.

It is to be noted that the refractive index in the deflector 60 may be adjusted according to the depth of a hole that is the structure 61. The shape of the structures 61 is not limited to these, and may be a groove like the one illustrated in FIG. 17C. As illustrated in FIG. 17D, the deflector 60 may be formed with a lattice-shaped structure 61.

The deflector 60 is provided on top of the color filter 70 in a direction in which light enters. The deflector 60 is provided for every multiple pixels P (in FIG. 16, every two pixels P). In this case, it is possible to reduce scattering of light at a boundary between pixels P and improve the quantum efficiency (QE). It is to be noted that the deflector 60 may be provided for each pixel P.

As described above, the deflector 60 has a characteristic of, for example, the refractive index that changes continuously. In the deflector 60 far from the center of the light receiving unit 10, a difference in the refractive index within the deflector 60 is larger than the deflector 60 close to the center of the light receiving unit 10. Thus, it is possible for the deflector 60 to change the traveling direction of incident light according to the angle of incidence of light. It may be said that the deflector 60 is a deflection device that deflects light by means of the metamaterial technology. It may also be said that the deflector 60 is a region (a light guiding region) in which the traveling direction of light that has entered is changed and is caused to pass therethrough.

Into the color filter 70, light that has passed through the deflector 60 enters. The color filter 70 allows, of incident light, light in a predetermined wavelength region to pass therethrough, and propagates the light toward the photoelectric converter 12. It is to be noted that the imaging device 1 may be provided with a lens unit (an on-chip lens) that concentrates light. This lens unit is provided on the side from which light enters, for example, above the deflector 60. By the on-chip lens being provided, it becomes possible to enhance a light condensing function and perform spectral separation in response to light at a wider range of angle of incidence.

[Action and Effect]

The imaging device 1 according to the present embodiment includes the light receiving unit 10 and the deflector

60. The light receiving unit 10 is provided with a plurality of the photoelectric converters 12 that each generate an electric charge through photoelectric conversion. The deflector 60 is stacked on the light receiving unit 10, and includes the structure 61 whose size is equal to or less than the wavelength of incident light and deflects the incident light. Furthermore, the deflector 60 has the refractive index that varies depending on the distance from the center of the light receiving unit 10.

The imaging device 1 is provided with, on the side from which light enters, the deflector 60 having the refractive index that varies depending on the distance from the center of the light receiving unit 10. Thus, even in a case where light enters obliquely, it is possible to appropriately deflect incoming light and cause the light to propagate to the color filter 70 and the photoelectric converter 12.

The size of the structure 61 may be a size that is equal to or less than one-tenth of the predetermined wavelength of incoming light. In this case, it is possible to perform the deflection in response to light at a wide range of angle of incidence and in a wide range of wavelengths. Furthermore, the space between the structures 61 may be a size that is equal to or less than one-tenth of the predetermined wavelength of incoming light.

4-1. Modification Example 6

FIG. 18 is a diagram illustrating an example of a cross-sectional configuration of the imaging device 1 according to Modification Example 6. The imaging device 1 according to the present modification example includes the above-described light separator 30. The light separator 30 is provided between the deflector 60 and the color filter 70. The light separator 30 separates light that has passed through the deflector 60, and causes the light to propagate toward the color filter 70.

If light obliquely enters the structure 31 of the light separator 30, there is a possibility that it may fail to accurately separate the light. In the imaging device 1 according to the present modification example, the deflector 60 is provided more on the light incident side than the light separator 30. Obliquely incoming light is deflected by the deflector 60, which makes it possible to make the angle of incidence of the light entering the light separator 30 smaller. Thus, it is possible to accurately separate the light that has entered and cause the light to propagate to the color filter 70 and the photoelectric converter 12. It is possible to suppress the decline of the spectral characteristics with respect to obliquely incident light.

5. Application Example

The above-described imaging device 1, etc. are applicable to all types of electronic apparatuses including an imaging function, for example, a camera system such as a digital still camera or a video camera, a cell phone having an imaging function, etc. FIG. 19 illustrates a schematic configuration of an electronic apparatus 1000.

The electronic apparatus 1000 includes, for example, a lens group 1001, the imaging device 1, a digital signal processor (DSP) circuit 1002, a frame memory 1003, a display unit 1004, a recorder 1005, an operation unit 1006, and a power supply unit 1007, and these are coupled to one another through a bus line 1008.

The lens group 1001 takes in incident light (image light) from a subject and forms an image on the imaging plane of the imaging device 1. The imaging device 1 converts an amount of incident light formed as an image on the imaging plane by the lens group 1001 into an electrical signal on a pixel-by-pixel basis, and supplies the electrical signal as a pixel signal to the DSP circuit 1002.

The DSP circuit 1002 is a signal processing circuit that processes a signal supplied from the imaging device 1. The DSP circuit 1002 outputs image data obtained by processing the signal from the imaging device 1. The frame memory 1003 temporarily holds therein the image data processed by the DSP circuit 1002 on a frame-by-frame basis.

The display unit 1004 includes, for example, a panel-type display device such as a liquid crystal panel or an organic electroluminescence (EL) panel, and records image data of a moving image or a still image captured by the imaging device 1 on a recording medium such as a semiconductor memory or a hard disk.

The operation unit 1006 outputs, in accordance with an operation by a user, an operation signal for various functions that the electronic apparatus 1000 has. The power supply unit 1007 fittingly supplies various kinds of power that is operating power of the DSP circuit 1002, the frame memory 1003, the display unit 1004, the recorder 1005, and the operation unit 1006 to these units to be supplied with.

6. Practical Application Examples (Practical Application to Moving Body)

The technique according to the present disclosure (the present technology) is applicable to various products. For example, the technique according to the present disclosure may be realized as a device mounted on any of types of moving bodies such as a motor vehicle, an electric vehicle, a hybrid electric vehicle, a motorcycle, a bicycle, a personal transporter, an airplane, a drone, a vessel, and a robot.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has been described an example of the moving body control system to which the technique according to the present disclosure may be applied. The technique according to the present disclosure may be applied to, of the configurations described above, for example, the imaging unit 12031. Specifically, for example, the imaging device 1 is able to be applied to the imaging unit 12031. By the application of the technique according to the present disclosure to the imaging unit 12031, it becomes possible to obtain a high-resolution taken image with less noise, and it becomes possible for the moving body control system to perform high-precision control using the taken image.

(Practical Application to Endoscopic Surgery System)

The technique according to the present disclosure (the present technology) is applicable to various products. For example, the technique according to the present disclosure may be applied to an endoscopic surgery system.

FIG. 22 is a view depicting an example of a schematic configuration of an endoscopic surgery system to which the technology according to an embodiment of the present disclosure (present technology) can be applied.

In FIG. 22, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 23 is a block diagram depicting an example of a functional configuration of the camera head 11102 and the CCU 11201 depicted in FIG. 22.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has been described an example of the endoscopic surgery system to which the technique according to the present disclosure may be applied. The technique according to the present disclosure may be applied to, of the configurations described above, for example, the imaging unit 11402 provided in the camera head 11102 of the endoscope 11100. By the application of the technique according to the present disclosure to the imaging unit 11402, it becomes possible to make the imaging unit 11402 more highly sensitive, and it becomes possible to provide the high-resolution endoscope 11100.

The present disclosure has been described above with the embodiments and their modification examples, the application example, and the practical application examples; however, the present technology is not limited to the above-described embodiments, etc., and it is possible to make various modifications. For example, in the above-described modification examples have been described as modification examples of the above-described embodiments; furthermore, it is possible to fittingly combine configurations of the modification examples. For example, the present disclosure is not limited to a back-illuminated image sensor, and is also applicable to a front-illuminated image sensor.

It is to be noted that the effects described in the present specification are merely an example. The effects of the present disclosure are not limited to those described in the present specification, and there may be other effects. Furthermore, the present disclosure may have the following configuration.

(1)

An imaging device including:

a light separator that separates first wavelength light included in a first wavelength region and second wavelength light included in a second wavelength region from incident light, the light separator including a structure whose size is equal to or less than a wavelength of incident light;

a first pixel including a first photoelectric converter that selectively receives the first wavelength light and performs photoelectric conversion on the first wavelength light;

a second pixel adjacent to the first pixel, the second pixel including a second photoelectric converter that selectively receives the second wavelength light and performs photoelectric conversion on the second wavelength light; and a light shielding unit that blocks incident light, the light shielding unit provided at a boundary between the first pixel and the second pixel.

(2)

The imaging device according to (1) described above, in which a refractive index of the structure is higher than a refractive index of a medium adjacent to the structure.

(3)

The imaging device according to (1) or (2) described above, in which the light shielding unit is provided to surround the light separator.

(4)

The imaging device according to any one of (1) to (3) described above, in which the light shielding unit is provided to cover a region surrounding the first and the second photoelectric converters.

(5)

The imaging device according to any one of (1) to (4) described above, in which the light shielding unit is a light guiding member that guides incident light.

(6)

The imaging device according to any one of (1) to (4) described above, in which the light shielding unit is an absorbent member that absorbs incident light or a reflective member that reflects incident light.

(7)

An imaging device including:

a light receiving unit provided with, along a first surface, a plurality of photoelectric converters that each generate an electric charge through photoelectric conversion; and a light separator that separates incident light, the light separator being stacked on the light receiving unit in a thickness direction perpendicular to the first surface and provided with a structure that varies depending on a distance from a center of the light receiving unit on the first surface.

(8)

The imaging device according to (7) described above, including, as the structure, a first structure and a second structure located farther from the center of the light receiving unit than the first structure, in which the plurality of photoelectric converters include a first photoelectric converter that photoelectrically converts light that has passed through the first structure and a second photoelectric converter that photoelectrically converts light that has passed through the second structure.

(9)

The imaging device according to (7) or (8) described above, in which, in a direction in which light enters, a length of the second structure is shorter than a length of the first structure.

(10)

The imaging device according to any one of (7) to (9) described above, in which a refractive index of the second structure is higher than a refractive index of the first structure.

(11)

The imaging device according to any one of (7) to (10) described above, in which the first structure and the second structure have shapes different from each other.

(12)

An imaging device including:

a deflector that deflects incident light, the deflector including a structure whose size is equal to or less than a wavelength of incident light;

a light separator that separates light that has passed through the deflector, the light separator including a structure whose size is equal to or less than a wavelength of incident light; and a photoelectric converter that photoelectrically converts light that has passed through the light separator.

(13)

The imaging device according to (12) described above, including a light receiving unit provided with a plurality of the photoelectric converters, in which the deflector includes multiple structures that differ in size from one another depending on a distance from a center of the light receiving unit.

(14)

The imaging device according to (12) or (13) described above, in which, in the deflector, a size of the structure at a first distance from the center of the light receiving unit is smaller than a size of the structure at a second distance from the center of the light receiving unit, the second distance being shorter than the first distance.

(15)

The imaging device according to any one of (12) to (14) described above, including a light receiving unit provided with a plurality of the photoelectric converters, in which the deflector includes a first structure and a second structure provided to surround the first structure, and a center of the first structure is located closer to a center of the light receiving unit than a center of the second structure is.

(16)

An imaging device including:

a light receiving unit provided with a plurality of photoelectric converters that each generate an electric charge through photoelectric conversion; and a deflector that deflects incident light, the deflector being stacked on the light receiving unit and including a structure whose size is equal to or less than a wavelength of incident light, in which the deflector has a refractive index that varies depending on a distance from a center of the light receiving unit.

(17)

The imaging device according to (16) described above, in which the deflector includes a plurality of the structures whose size is equal to or less than one-tenth of a wavelength of incident light.

(18)

The imaging device according to (16) or (17) described above, in which the deflector includes the structure whose size varies depending on the distance from the center of the light receiving unit.

(19)

The imaging device according to any one of (16) to (18) described above, in which, in the deflector, a size of the structure far from the center of the light receiving unit is smaller than a size of the structure close to the center of the light receiving unit.

(20)

The imaging device according to any one of (16) to (19) described above, including a light separator that separates light that has passed through the deflector, the light separator including a structure whose size is equal to or less than a wavelength of incident light and provided between the deflector and the photoelectric converters, in which the photoelectric converters photoelectrically convert light that has passed through the light separator.

The present application claims the benefit of Japanese Priority Patent Application JP2021-129695 filed with the Japan Patent Office on Aug. 6, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:

a light separator configured to separate first wavelength light of a first wavelength region of incident light and second wavelength light of a second wavelength region of the incident light from the incident light, wherein the light separator comprises a structure, and a size of the structure is one of is equal to or less than a wavelength of the incident light;

a first pixel that includes a first photoelectric converter configured to:

receive the first wavelength light; and execute photoelectric conversion on the first wavelength light;

a second pixel adjacent to the first pixel, wherein the second pixel includes a second photoelectric converter configured to:

receive the second wavelength light; and execute photoelectric conversion on the second wavelength light; and a light shielding unit configured to block the incident light, wherein the light shielding unit is at a boundary between the first pixel and the second pixel, and the light shielding unit surrounds the light separator.

2. The imaging device according to claim 1, wherein a refractive index of the structure is higher than a refractive index of a medium adjacent to the structure.

3. The imaging device according to claim 1, wherein the light shielding unit covers a region surrounding the first photoelectric converter and the second photoelectric converter.

4. The imaging device according to claim 1, wherein the light shielding unit is a light guiding member configured to guide the incident light.

5. The imaging device according to claim 1, wherein the light shielding unit is one of:

an absorbent member configured to absorb the incident light; or a reflective member configured to reflect the incident light.

6. An imaging device, comprising:

a light receiving unit, wherein the light receiving unit includes a plurality of photoelectric converters, the plurality of photoelectric converters is on a surface of the light receiving unit, and each of the plurality of photoelectric converters is configured to generate an electric charge through photoelectric conversion;

a first pixel that includes a first photoelectric converter of the plurality of photoelectric converters;

a second pixel that includes a second photoelectric converter of the plurality of photoelectric converters;

a light separator configured to separate first wavelength light of a first wavelength region of incident light and second wavelength light of a second wavelength region of the incident light from the incident light, wherein the light separator is on the light receiving unit in a thickness direction perpendicular to the first surface of the light receiving unit, the light separator comprises a structure, the structure varies based on a distance of the structure from a center of the light receiving unit, and the center of the light receiving unit is on the surface of the light receiving unit; and a light shielding unit configured to block the incident light, wherein the light shielding unit is at a boundary between the first pixel and the second pixel, and the light shielding unit surrounds the light separator.

7. The imaging device according to claim 6, wherein the structure of the light separator includes a first structure and a second structure, a location of the second structure is farther from the center of the light receiving unit than a location of the first structure, the first photoelectric converter is configured to photoelectrically convert light that has passed through the first structure, and the second photoelectric converter is configured to photoelectrically convert light that has passed through the second structure.

8. The imaging device according to claim 7, wherein, in a direction in which light enters, a length of the second structure is shorter than a length of the first structure.

9. The imaging device according to claim 7, wherein a refractive index of the second structure is higher than a refractive index of the first structure.

10. The imaging device according to claim 7, wherein the first structure has a shape that is different from a shape of the second structure.

11. An imaging device, comprising:

a deflector configured to deflect incident light, wherein the deflector includes a structure, and a size of the structure of the deflector is one of equal to or less than a wavelength of the incident light;

a light separator configured to separate first wavelength light of a first wavelength region of first light and second wavelength light of a second wavelength region of the first light from the first light, wherein the first light has passed through the deflector, the light separator includes a structure, and a size of the structure of the light separator is one of equal to or less than the wavelength of the incident light;

a plurality of photoelectric converters configured to photoelectrically convert second light, wherein the second light has passed through the light separator;

a first pixel that includes a first photoelectric converter of the plurality of photoelectric converters;

a second pixel that includes a second photoelectric converter of the plurality of photoelectric converters; and a light shielding unit configured to block incident light, wherein the light shielding unit is at a boundary between the first pixel and the second pixel, and the light shielding unit surrounds the light separator.

12. The imaging device according to claim 11, further comprising a light receiving unit, wherein the light receiving unit includes the plurality of photoelectric converters, the deflector includes multiple structures that differ in size based on a distance from a center of the light receiving unit, and the multiple structures of the deflector includes the structure of the deflector.

13. The imaging device according to claim 12, wherein, in the deflector, a size of a first structure of the multiple structures at a first distance from the center of the light receiving unit, is smaller than a size of a second structure of the multiple structures at a second distance from the center of the light receiving unit, and the second distance is shorter than the first distance.

14. The imaging device according to claim 11, further comprising a light receiving unit, wherein the light receiving unit includes the plurality of photoelectric converters, the deflector includes a first structure and a second structure, the second structure surrounds the first structure, and a location of a center of the first structure is closer to a center of the light receiving unit than a location of a center of the second structure.

15. An imaging device, comprising:

a light receiving unit that includes a plurality of photoelectric converters, wherein each of the plurality of photoelectric converters is configured to generate an electric charge through photoelectric conversion;

a deflector configured to deflect incident light, wherein the deflector is on the light receiving unit, the deflector includes a structure, a size of the structure of the deflector is one of equal to or less than a wavelength of the incident light, and a refractive index of the deflector varies based on a distance of the structure of the deflector from a center of the light receiving unit;

a light separator configured to separate first wavelength light of a first wavelength region of first light and second wavelength light of a second wavelength region of the first light from the first light, wherein the first light has passed through the deflector;

a first pixel that includes a first photoelectric converter of the plurality of photoelectric converters;

a second pixel that includes a second photoelectric converter of the plurality of photoelectric converters; and a light shielding unit configured to block incident light, wherein the light shielding unit is at a boundary between the first pixel and the second pixel, and the light shielding unit surrounds the light separator.

16. The imaging device according to claim 15, wherein the deflector includes a plurality of structures, each structure of the plurality of structures has a size that is one of equal to or less than one-tenth of the wavelength of the incident light, and the plurality of structures includes the structure of the deflector.

17. The imaging device according to claim 15, wherein the size of the structure of the deflector varies based on the distance of the structure of the deflector from the center of the light receiving unit.

18. The imaging device according to claim 15, wherein in the deflector, a location of a first structure is farther from the center of the light receiving unit than a location of a second structure, and the size of the first structure is smaller than the size of the second structure.

19. The imaging device according to claim 15, wherein the light separator includes a structure whose size is one of equal to or less than the wavelength of the incident light, the light separator is between the deflector and the plurality of photoelectric converters, the plurality of photoelectric converters is further configured to photoelectrically convert second light, and the second light has passed through the light separator.

* * * * *